United States Patent [19]
Rostoker et al.

[11] Patent Number: 5,838,163
[45] Date of Patent: Nov. 17, 1998

[54] TESTING AND EXERCISING INDIVIDUAL, UNSINGULATED DIES ON A WAFER

[75] Inventors: Michael D. Rostoker, Boulder Creek; Carlos Dangelo, Los Gatos; James Koford, San Jose, all of Calif.

[73] Assignee: LSI Logic Corporation, Milpitas, Calif.

[21] Appl. No.: 578,742

[22] Filed: Dec. 26, 1995

Related U.S. Application Data

[60] Continuation of Ser. No. 385,341, Feb. 8, 1995, Pat. No. 5,539,325, which is a division of Ser. No. 908,687, Jul. 2, 1992, Pat. No. 5,442,282.

[51] Int. Cl.$^6$ .................................................. G01R 31/28
[52] U.S. Cl. ..................... 324/763; 324/765; 324/73.1; 324/158.1
[58] Field of Search ...................... 324/73.1, 158.1, 324/765, 763; 371/22.6; 637/8; 340/825.07; 257/40, 48

[56] References Cited

U.S. PATENT DOCUMENTS

| | | |
|---|---|---|
| 4,486,705 | 12/1984 | Stopper .................................. 324/73.1 |
| 4,956,602 | 9/1990 | Parrish ................................... 371/22.6 |
| 4,961,053 | 10/1990 | Krug ...................................... 324/73.1 |
| 5,053,700 | 10/1991 | Parrish ................................... 371/22.6 |
| 5,059,899 | 10/1991 | Farnworth et al. ..................... 324/73.1 |
| 5,266,890 | 11/1993 | Kumbasar et al. .................... 324/73.1 |

*Primary Examiner*—Vinh P. Nguyen
*Attorney, Agent, or Firm*—Oppenheimer Poms Smith

[57] ABSTRACT

Signals (including probes) from an external system are selectively connected to a plurality of unsingulated dies on a semiconductor wafer with a minimum number of connections and an electronic selection mechanism resident on the wafer. The electronic selection mechanism is connected to the individual dies by conductive lines on the wafer. The electronic selection mechanism is capable of providing the external signals (or connecting the external probe) to a single die or groups of the dies, and electronically "walking through" the entire plurality of unsingulated dies. Redundant conductive lines may be provided. Diodes and/or fuses may be provided in conjunction with the conductive lines, to protect against various faults which may occur in the conductive lines. Redundant electronic selection mechanisms may also be provided to ensure the ability to selectively provide signals to the unsingulated dies.

7 Claims, 27 Drawing Sheets

TESTING AND EXERCISING INDIVIDUAL, UNSINGULATED DIES ON A WAFER

This application is a continuation application of U.S. patent application Ser. No. 08/385,341 filed Feb. 8, 1995, now U.S. Pat. No. 5,539,325, which is a division of U.S. patent application Ser. No. 07/908,687, filed Jul. 2, 1992, now U.S. Pat. No. 5,442,282.

TECHNICAL FIELD OF THE INVENTION

This invention relates to integrated circuit (IC) semiconductor devices and, more particularly to the powering-up, testing and burning-in of such devices (dies).

BACKGROUND OF THE INVENTION

Modern integrated circuits are generally produced by creating several identical integrated circuit dies (usually square or rectangular areas) in an area on a single (usually round) semiconductor wafer, then scribing and slicing the wafer to separate (singulate, dice) the dies (chips) from one another. An orthogonal grid of "scribe line" (kerf) areas extends between adjacent dies, and sometimes contain test structures, for evaluating the fabrication process. These scribe lines areas, and anything contained within them, will be destroyed when the dies are singulated from the wafer. The singulated (separated) dies are then individually packaged, and may be tested after packaging.

Under ordinary circumstances, pressure to maximize the useful, or productive area of a wafer dictates that scribe line area be kept as small as possible. Dies are laid out on a wafer in a pattern that is packed as tightly as possible. Scribe line widths are only large enough to ensure that the dies can be separated without damage to the area of the dies.

Circuits and active elements on the dies are created while the dies are still together (un-singulated) on the wafer by ion deposition, electron beam lithography, plasma etching, mechanical polishing, sputtering, and numerous other methods which are well known to those skilled in the art of semiconductor fabrication. These processes are highly developed and are capable of producing extremely complicated circuits on the dies at a relatively low cost.

The complexity of integrated circuits is limited, in part, by the purity of the semiconductor wafers available. These wafers contain minuscule defects which may be distributed randomly throughout the wafer, especially the surface where integrated circuit elements are fabricated. The larger the integrated circuit (i.e., the greater its "die size"), the greater the probability that it will be affected by such a defect. Integrated circuits which intersect a defect on the semiconductor wafer are generally rendered non-functional, and therefore useless. Improvements in the wafer production process are yielding purer wafers with smaller defect sizes and densities.

By reducing the size of individual circuit elements, e.g. transistors, it has become possible to place more circuitry in the same area (e.g., die site) which would previously have been occupied by larger circuit elements of lesser complexity. However, the same size reductions which enable greater circuit complexity also render the resulting smaller circuits more sensitive to more minuscule defects in the semiconductor wafer.

Trade-offs between circuit complexity (i.e., number of transistors and circuit area) and anticipated yield (i.e., the number of "good" circuits per wafer) are made by integrated circuit manufacturers based upon a number of factors. The higher the yield, the less a circuit costs the manufacturer to produce, permitting a lower market price.

Among the problems faced by integrated circuit manufacturers are packaged chips (dies) which fail in final test and, even worse, chips which pass final test but which have undetected flaws due to an inability to test them completely. The inability to test an integrated circuit completely arises from the fact that while circuit density and complexity has increased dramatically, the number of Input/Output (I/O) pads which can feasibly be disposed to a chip has not increased correspondingly. Generally, pads are much larger than individual circuit elements. This creates serious testing problems, since ever-increasing amounts of test information must be obtained through the use of a relatively limited number of I/O pads (test points). "Burn-in" is a process whereby a chip (die) is either simply powered up ("static" burn-in), or is powered up and has signals exercising to some degree the functionality of the chip ("dynamic" burn-in). In both cases, burn-in is typically performed at an elevated temperature—the object being to detect chips that are defective. Burn-in is usually performed on a die-by-die basis, after the dies are separated (diced) from the wafer.

Another technique for burning-in dies, prior to dicing (on the wafer), is to mechanically place test probes or bond wires on each die, or on pads associated with each individual die and located in the scribe lines between the dies.

Another technique for burning-in dies, prior to dicing (on the wafer), is to provide a common network of power and ground conductors in the scribe lines, the power and ground lines connected to all of the dies on a wafer. Generally, the power and ground lines simply power up the device for static burn-in, but built-in self test (self-starting, signal-generating) circuitry on the chip can also provide signals on power up to exercise some of the functionality of the chip. This is discussed in copending, commonly-owned U.S. patent application No. 07/933,325 filed on Aug. 21, 1992, entitled METHODS FOR DIE BURN-IN, filed by Rostoker and Dell'Oca.

It should be noted that where "power and ground" are referred to herein, any and all power connections are included. Recent trends in technology have tended to push the design of semiconductor devices in the direction of single voltage supplies, and this terminology reflects this trend. However, herein, the term "power and ground" refers to all required power supply voltages.

Another technique for die burn-in, on the wafer, is discussed in the aforementioned copending, commonly-owned U.S. patent application No. 07/933,325. This technique involves bonding wires to the wafer either (1) to bond pads on each die, or (2) to bond pads for each die in adjacent scribe lines.

Generally, for either burn-in or testing , difficulties arise in a few areas:

1) Traditional methods of testing do not provide adequate fault coverage to guarantee that the dies identified as functional ("good") are indeed fully functional;
2) A large number of test points is generally required, necessitating cumbersome expensive equipment to interface with the wafer for testing; and
3) Routing channels for signal interconnections can require a great deal of surface area.

In recent years, a number of schemes have arisen to address the testability problems of large, complex integrated circuits. Some examples of these techniques are known as SCAN or "Scan-path testing" (ref. T. W. Williams and K. P. Parker, "Design for Testability—A survey" Proc. IEEE, Vol.

71, pp. 98–112, Jan., 1983), BIST or "Built-in Self-Test" (ref. E. B. Eichelberger and T. W. Williams, "A logic Design Structure for LSI Testing", Proc. 14th Design Automation Conf., June, 1977, 77CH1216-1C, pp. 462–468; also, E. J. McClusky, "Built-In Self-Test Techniques" and "Built-In Self-Test Structures" IEEE Design and Test, Vol.2, No. 2, pp. 437–452, April, 1985). These techniques deal with testing large integrated circuit structures by incorporating on-chip test facilities (structures) which allow stimuli to be applied to portions of the circuit and responses to be readily read back and observed. SCAN and BIST testing are based on providing a means for accessing the storage elements of a sequential circuit (e.g. flip-flops) and using them to control and/or observe various portions of the integrated circuit to which they are applied.

U.S. Pat. Nos. 3,806,891; 3,761,675; 4,293,919; and 4,513,418 (assigned to the IBM Corporation) describe methods whereby the flip-flops of a circuit may be used as test points by re-configuring them into a serial chain (shift-register) and used to shift in test data and to shift out test results.

U.S. Pat. No. 4,340,857 (Fasang) describes the use of linear feedback shift registers (LFSRs) for generating test patterns and for compacting test results.

U.S. Pat. No. 4,423,509 (Feisel) describes yet another use of the flip-flops of an integrated circuit as test points.

Another technique applicable to a broader range of test problems is described in U.S. Pat. No. 4,749,947 (Gheewala), entitled "Grid-Based, 'Cross-Check' Test Structure for Testing Integrated Circuits", incorporated by reference herein. The patent is directed to providing a grid of externally- as well as individually-accessible probe lines and sense lines with electronic switches at the crossings of these probe and sense lines. One end of each switch is connected to a test point on a die, which test point is intended to be monitored or controlled during a testing regimen, and the other end of each switch is connected to an associated sense line. The ON or OFF state of each switch is governed by a control input from a probe line. The probe and sense lines are connected to external test electronics. By excitation of an appropriate probe line, and monitoring (or exciting) an appropriate sense line, test signals present at any one of the test points can be monitored (or controlled). Generally, four lines per die are required: power, ground, a plurality of probe lines, and a plurality of sense lines. (In the case of a die requiring multiple supply voltages, U.S. Pat. No. 4,749,947 also suggests the possibility of cross-checking multiple ICs on a wafer. FIG. 7 therein shows a grid of numerous probe and sense lines criss-crossing multiple ICs. FIGS. 9a and 9b therein also show many ICs being cross-checked on a wafer. In FIG. 9a, the usually unused "kerf area" (scribe line) lying between adjacent ICs is used to place probe points for the probe and sense lines. In FIG. 9b, it is suggested that I/O pads on "other" (typically adjacent) ICs can be used as probe points for cross check testing a particular ICs, when the "other" ICs are not being cross checked.

U.S. Pat. No. 4,937,826 (Gheewala, et al.), entitled "Method and Apparatus for Sensing Defects in Integrated Circuit Elements", incorporated by reference herein, describes an improvement to the technique of the aforementioned U.S. Pat. No. 4,749,947, involving pre-charging the sense lines to adjust detection levels. The patent also discloses a method of reducing test patterns to Boolean expressions, using "path sensitization".

U.S. Pat. No. 4,975,640 (Lipp), entitled "Method for Operating a Linear Feedback Shift Register as a Serial Shift Register with a Crosscheck Grid Structure", incorporated by reference herein, describes a further improvement to the aforementioned U.S. Pat. No. 4,749,947, whereby a linear feedback shift register (LFSR) may be used in combination with the grid based cross check structure to reduce the number of logic structures required to shift data out serially, and to provide increased controllability over the cross check structure with compaction of the test result data while dramatically reducing the number of I/O points required to accomplish the testing.

The techniques of testing, particularly cross-check testing described above are largely per-die-oriented, with little or no teaching of efficient implementation at wafer level.

Similarly, the techniques of static or dynamic burning-in, described above, fail to show efficient implementation at wafer level.

What is needed is efficient techniques for implementing cross-checking (testing) and dynamic burning-in at wafer level. For example, with regard to the cross-check techniques, in order to efficiently test numerous dies on a wafer, it would be desirable to dramatically reduce the number of probe and sense lines required. A reduction on the order of "n"/2:1 where "n" is the number of dies on the wafer is this kind of "dramatic" reduction (i.e., a reduction in the number of probe and sense lines of 50:1 for a wafer with 100 dies on it is a "dramatic" reduction over known cross-check techniques.

DISCLOSURE OF THE INVENTION

It is therefore one object of the present invention to provide a technique for electrically accessing individual, unsingulated dies on a wafer, for the purpose of powering-up, providing signals from an external source to, and/or testing the dies individually or in groups.

It is a further object of the present invention to provide a technique for testing individual, unsingulated semiconductor dies, prior to the dies being diced (singulated) from the wafer, with a minimum number (relatively few compared with the number of dies) of "test points" (probe and sense lines) required on the wafer.

It is a further object of the present invention to provide substantially 100% fault coverage (testing) for all of the dies on a wafer.

It is a further object of the present invention to provide a technique for burning-in individual dies, prior to the dies being diced (singulated) from the wafer, with a minimum number of lines.

It is a further object of the present invention to provide a technique for selecting and isolating individual dies on a wafer.

It is a further object of the present invention to accomplish the above mentioned testing with the same physical and/or electrical interface for all of the dies on a given wafer, even though the dies may be of different size and may perform different functions.

According to the invention, these and other objects are achieved by implementing a technique for electronically (rather than mechanically) "walking around" a wafer to provide power to and/or to stimulate and/or to monitor (probe) individual dies on a selectable basis, either for cross-check-type or similar testing or for burn-in, especially dynamic burn-in. For the purposes of the invention, the term "individual dies" means either: 1) a single die; or 2) a number of dies significantly less then the total number of dies on the wafer. That is, "electronically selecting a small number (relative to the total number of dies, such as a row, a column, or any other small group of dies) of dies on a wafer", and "electronically selecting a single die on a wafer" are both described by the phrase "electronically selecting individual dies on a wafer". The invention further makes use of "normal" die sites, "mutant" die sites, and scribe line area, defined hereinbelow. Suitable implementations of the technique involve one or more of the following:

1. Placing an appropriate, minimum number of conductors in the scribe line areas on a wafer, including:
   a. At least one power line and at least one ground line for powering up the dies for testing and for burning-in.
   b. A plurality of probe lines and a plurality of sense lines for implementing a cross-check type testing methodology.
   c. Preferably, redundant power and ground lines are provided, to provide coverage in the event of an open line.
2. Providing a means of isolating short circuits, whether these shorts occur on a particular die (more likely) or in the conductors (especially power and ground) in the scribe lines (less likely). This is accomplished by:
   a. Fabricating diodes at the interface of the power and ground lines to the individual dies. This will prevent a faulty (e.g., shorted) die from interfering with the powering up of other (good) dies.
   b. Fabricating diodes at strategic locations along the paths of the scribe line power and ground conductors, such as a pair of diodes for each row and column of power and ground conductors.
   c. Alternatively (or additionally), providing fusible connections in the power and ground conductor lines.
3. Providing a mechanism for implementing die selection, such as:
   a. multiplexers (muxes);
   b. shift registers;
   c. steppers; or
   d. a separate electron beam probe apparatus.
4. Providing an electronic mechanism in an area of the wafer for selecting individual dies for testing and/or burn in by either:
   a. Using mutant die-sites for the die select mechanism (muxes, semiconductor switches, and the like).
   b. Using one or more otherwise "good" die sites, sacrificially, for the die select mechanism (muxes and the like), rather than for fabricating devices to be used after dicing.
   c. Providing at least a portion of the cross-check type testing electronics on the wafer, either in the scribe line areas, or at particular die sites.
   d. by forming a discrete structure on and overlying the wafer.
   e. In any case, preferably, leaving sufficient electronics on each chip, so that individual dies can be tested after dicing or packaging, as well as on the wafer.
5. Providing a unique address for each die, on the die, by either:
   a. Providing on-die circuitry responsive to a unique binary parallel or serial pattern (which would require a "merging" of die-location-independent standard die electronics with die-location-dependent circuitry at or prior to fabrication time).
   b. Providing circuitry for detecting unique die addresses in the area of the scribe lines.
6. Rather than placing the power and ground, and/or the probe and sense lines in the scribe lines, or through or on adjacent dies, providing the power, ground, probe and sense lines in a grid of overlying metal lines, whereby:
   a. Vias are provided from the grid of overlying metal lines to the individual dies;
   b. The overlying grid of lines also provides for electromagnetic (EM) shielding of the devices (dies) on the wafer;
   c. The overlying grid of metal lines can also be used to subsequently interconnect dies;
   d. The overlying grid of metal lines can also be subsequently polished away, and re-worked (if defective) or reformed in a different configuration to interconnect "good" dies.
7. Integrating signal exercising circuits, signal generators, power-on reset circuits, or self-starting self-test circuits onto the wafer for generating signals for dynamic burn-in, thereby avoiding a plurality of dynamic-burn-in signal lines, permitting automatic power-on initialization of dies and test circuitry, and minimizing the number of physical probe points required to control elaborate test sequences. This circuitry may be placed in mutant die sites, normal die sites, in the scribe line area, or any combination of these.
8. Using a separate E-beam tool to:
   a. insert signals for testing and/or dynamic burn-in, or
   b. alternatively or additionally, providing latching and/or toggling circuits specifically for use in conjunction with such an E-beam tool, providing "touch switches", that an E-beam tool may "touch" once to generate a signal which will remain after the E-beam tool has moved on to another point on the wafer.
9. Mounting the wafer, such as by a vacuum chuck to a heating platform, to elevate the temperature of the dies on the wafer for burn-in.
10. Providing redundant die selection circuitry in conjunction with appropriate isolation circuitry (e.g. fusible links) to minimize the likelihood that a flawed selection circuitry will prevent testing and burning in of dies prior to dicing.

By testing and burning-in unsingulated dies prior to dicing them from the wafer, using electronic die selection techniques, the "slew" time from die-to-die is greatly reduced vis-a-vis any type of hard wiring to individual dies ("flying wire"), mechanical probing or test-after-dice methodology.

A further advantage of electronically (versus mechanically) selecting individual dies on a wafer for testing and/or burning-in is that integrated circuit Input/Output (I/O) pads are shrinking to the point where they are simply becoming difficult to mechanically probe. By being able electronically to "walk around" the wafer, any pad size is a non-problem.

A further advantage of the present invention, namely testing and especially burning-in at wafer level, is that test sockets and burn-in boards are expensive accessories increasing the overall cost of fabrication which must be amortized.

Other objects, features and advantages of the invention will become apparent in light of the following description thereof.

BRIEF DESCRIPTION OF THE DRAWINGS

FIGS. 4a–4d are simplified schematics of selector switches as they relate to the present invention.

DETAILED DESCRIPTION OF THE INVENTION

Figure 1A:
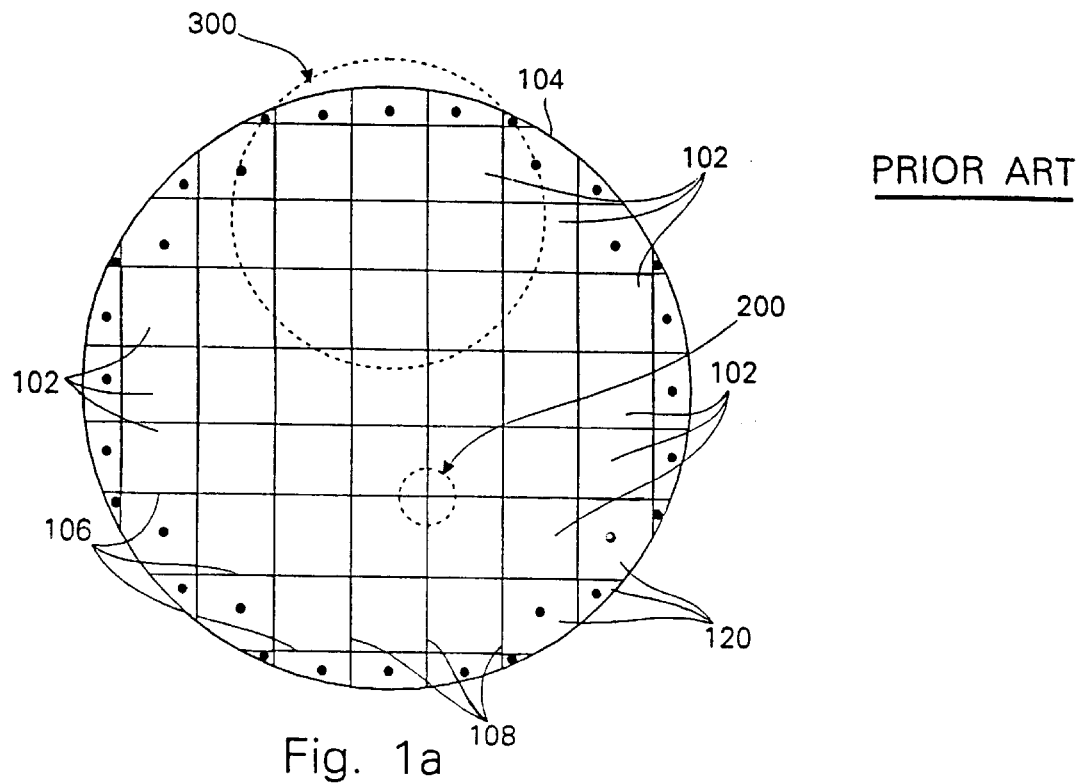
FIG. 1*a* is a diagram of the prior art showing various features of a wafer, including normal dies, mutant dies, and scribe lines.

In the Figures, where a schematic representation is used, crossing conductors (lines representing wires or conductors which intersect in a "+" or plus sign configuration) are not connected, while conductors (lines representing wires or conductors) which intersect in a "T" configuration are connected.

Power supply signals are defined herein as a special case of the more general set of electrical (or electronic) signals. Any description of a technique herein for switching of electrical (or electronic) signals inherently applies to the switching of power supply signals, as well.
FIGURES 1a–1b, 2a–2b FIG. 1a shows a plurality of die sites 102 which have been created on the face of a semiconductor wafer 104. The wafer is usually round, having a diameter on the order of 3–4 inches, and the dies are usually square, having a side dimension on the order of one-eighth to one-half inch, or larger. For illustrative clarity, only a limited number of dies 102 are shown on the wafer 104. There can be a hundred or more dies on a given wafer.

A grid of horizontal scribe lines 106 and vertical scribe lines 108 on the surface of the wafer delineate one die from another. Ordinarily, after all processing at wafer level has been completed, the dies (chips) are singulated from the wafer. These scribe lines are usually fairly "wide", in terms of device geometries, allowing numerous semiconductor devices and connections to be contained in the space of the scribe lines, between the dies. Typically, all of the dies are fabricated in an identical manner to contain identical semiconductor circuits. Typically, the individual dies (chips) are packaged in some manner to interface with external (to the chip) systems or components.

It can easily be seen that square dies 102 are not geometrically obtainable around the periphery of the round wafer 104. (By way of analogy—square pegs simply do not fit neatly into round holes.) To the contrary, substantially entirely around the periphery of the wafer there are "mutant" (irregular) die sites 120, of varying shapes and sizes (shown with a dot to distinguish the mutant die sites 120 from the regular ("normal", "good") die sites 102), whereat square dies simply are not obtainable.

According to the present invention, the wafer "real estate" (namely, the aggregate of mutant die sites) that is otherwise wasted is advantageously employed for implementing a scheme of selectively burning-in and selectively cross-checking all of the normal dies on a wafer.

Figure 1B:
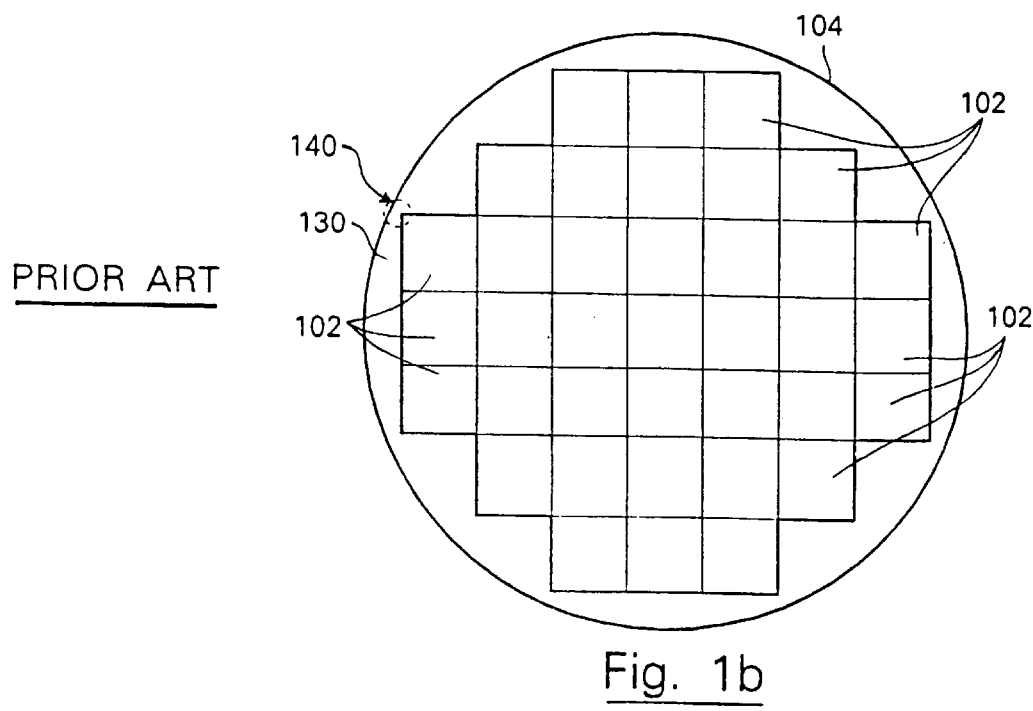
FIG. 1b is a diagram of the prior art illustrating "pinch points" and the peripheral area of a wafer.

Referring to FIG. 1b, wafer 104 of FIG. 1a is presented once again, but this time the area covered by mutant die sites (120 with respect to FIG. 1a) is considered collectively as a peripheral area 130. In this Figure, the scribe lines have been artificially truncated at the boundaries of the peripheral area 130 for illustrative clarity. This peripheral area 130 forms a complete "ring" around the outer portions of the wafer, completely encircling dies 102. According to the present invention, this peripheral area 130 may be used to contain circuitry, and/or may be used as a routing area for signals requiring access to the scribe lines as routing channels, or for further connection to circuitry contained within the scribe lines or within any of the dies 102.

In the event that the corners of normal dies 102 come so close to the edge of wafer 104 the peripheral area 130 is pinched too tightly to be of use for signal routing around the wafer 104, such as at pinch point ("bottleneck") 140 in FIG. 1b, it is possible to alter layout rules for fabricating wafer 104 or to sacrifice the space for one or more normal dies 102 in the fabrication process, thus reducing the number of normal dies, but expanding the peripheral area 130 available and eliminating such "bottlenecks" 140. According to the present invention, it is possible to make use of the area from any normal die sites 102 so sacrificed by placing test and burn-in circuitry in that area (described in detail below).

As mentioned above, physical defects or flaws in the wafer itself can render a circuit or part of a circuit inoperative. Also, defects in the fabrication process itself can render a circuit or part of a circuit inoperative.

It is essential to be able to determine which of the many dies on a wafer have physical or fabrication defects which render or would render the circuitry on the die inoperative. To this end, two techniques (among others) are well known to be employed: (1) burn-in; and (2) electrical testing, typically in this order.

With respect to burn-in, there are two regimens of particular interest: (1) "static" burn-in where a chip is simply powered up, preferably at an elevated temperature; and (2) "dynamic" burn-in wherein the chip is powered up (again, preferably at an elevated temperature) and certain inputs/outputs (I/Os) on the chip are exercised with appropriate signals. These signals may be applied from external sources, or may originate within self-test circuitry on the chip itself.

Typically, static and/or dynamic burn-in is performed after the chips are singulated from the wafer. This requires some kind of mounting for the chip, and a means of making power, ground and signal connections to the chip. In some cases, the die is partially or completely packaged prior to burn-in.

It is also known, however, to probe bond pads (test sites) on individual dies prior to their being singulated from the wafer. In this case, power, ground and signal are applied by probes to a particular die, the die is burned in, and the probes are mechanically moved to another die. The process is repeated until all of the dies on the wafer are tested. At this point, a "map" of passed (good) and failed (bad) dies can be generated, and the bad dies can be discarded after singulation (dicing).

Figure 2A:
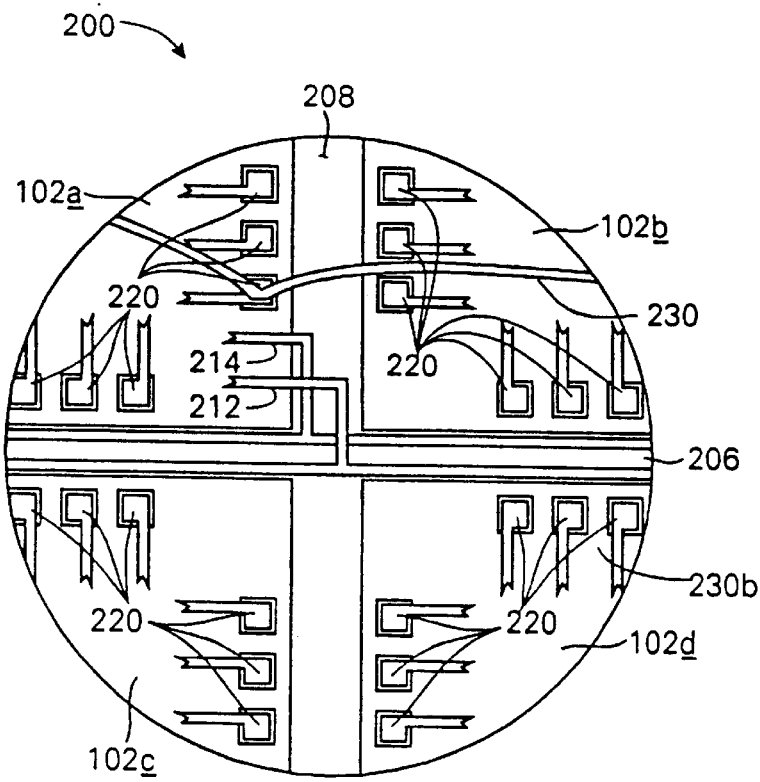
FIGS. 2a and 2b are sections of a wafer.

FIG. 2a is a section 200 of the wafer 104 (FIG. 1a) showing the corners of four adjacent dies 102a, 102b, 102c, and 102d, (similar to normal dies 102) on a portion of the wafer 204, the dies delineated from one another by a grid of horizontal scribe lines 206 and vertical scribe lines 208 (similar to horizontal and vertical scribe lines 106 and 108, respectively). As disclosed in co-pending, commonly-owned U.S. patent application No. (LLC-2087), entitled METHODS FOR DIE BURN-IN, a pair of conductors 212 and 214, for power and ground, respectively, can be disposed in the scribe lines to power up all of the chips for burn-in. In the Figure, the conductors 212 and 214 are shown routed primarily in a horizontal scribe line, and branching off via a vertical scribe line into the corner of a particular chip 202a. Once within the area of the die, the conductors are connected by any suitable means to the appropriate power and ground lines within the die.

The conductor (conductive line) 212 is shown crossing over the conductor 214 at two points, indicating that either:

a. two levels (layers) of metallization with an intervening layer of an insulating material are required;
b. one of the conductors 212 or 214 is integrated into the wafer as a poly-line or similar conductor, and the other is an overlying metal conductor; or
c. both conductors 212 and 214 are integrated into the wafer as poly-lines or similar conductors, and the crossovers are accomplished with overlying metal (or other) conductors, with an intervening layer of an insulating material (typically SiO$_2$).

At least one such cross-over would appear to be required.

The conductors 212 and 214 would branch off similarly into corresponding corners of the other chips on the wafer. In this manner, several chips (e.g., in a particular horizontal row on the wafer) can be powered up with a single pair of conductors running through a horizontal scribe line.

FIG. 2a also shows bond pads 220 on each die, typically around the perimeter of each die.

As shown in FIG. 2a, the aforementioned U.S. patent application No. (LLC-2087) also discloses connecting discrete external wires 230 ("flying wires") to particular bond pads 220 on the die. These discrete wires preferably carry signals for dynamic burn-in, and the particular pads to which the wires are connected may be dedicated to dynamic burn-in (i.e., they are not necessarily "normal" I/O pads in the functional sense).

Figure 2B:
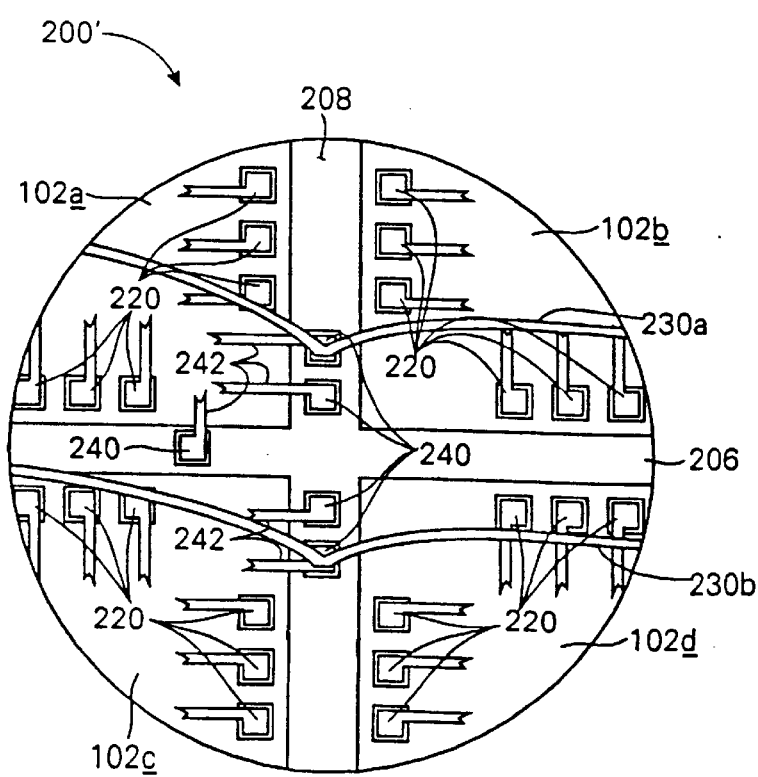

FIG. 2b illustrates a section 200' of a wafer, similar to 200 (FIG. 2a), illustrating a variation on the theme set forth in FIG. 2a, wherein the external wires 230 (two shown), are connected to bond pads 240 formed in the scribe lines adjacent a particular die, rather than to bond pads on the die. These pads 240 would be formed similar to the pads 220, except for their location in the scribe line rather than on the die. A conductive trace 242 is provided from the external (to the die) burn-in pad 240 to the appropriate circuit location on the die. In this embodiment, the pads 240 are sacrificial in the sense that they will be excised during die singulation.

In any of the methods for burn-in disclosed in the aforementioned U.S. patent application No. (LLC-2087), it is generally required that there be a separate and complete set of test points per die on the wafer.

As mentioned hereinabove, U.S. Pat. No. 4,749,947 shows in FIG. 9a therein the placement of probe points 74 and 76 in the "kerf area" (scribe lines) between dies. In this case, one set of probe points can be used to probe two adjacent dies. In FIG. 9b therein, it is shown that normally unused I/O pads on the dies themselves can also be used as probe points for other dies. These techniques all relate to cross-check testing of dies on a wafer, and somewhat reduce the need for a separate and complete set of probe points for each die on a wafer.

What is needed is a technique for substantially reducing the number of test points and power (i.e., power and ground) lines needed for burning-in a plurality of dies on a wafer, and similarly substantially reducing the number of probe points needed for cross-check testing a plurality of dies on a wafer.

According to the present invention this object is generally achieved by:

(a) providing a limited, dramatically reduced number of pads for connecting the wafer to external power, ground or signal sources, either:
  (i) in the scribe lines;
  (ii) at dedicated die sites on the wafer; and/or
  (iii) on a layer overlying the wafer.
(b) providing means for selectively connecting the limited number of pads to the individual dies;
(c) preferably using the same limited number of pads for both burning-in and for cross-check testing; and
(d) providing redundant lines from the pads to the individual dies, to prevent open circuits in the lines from rendering inoperative the burn-in and/or cross-check-test regimens.
(e) providing coverage against the eventuality of short circuits on the die or in the scribe lines rendering inoperative the burn-in and/or cross-check-test regimens.

Figure 3A:
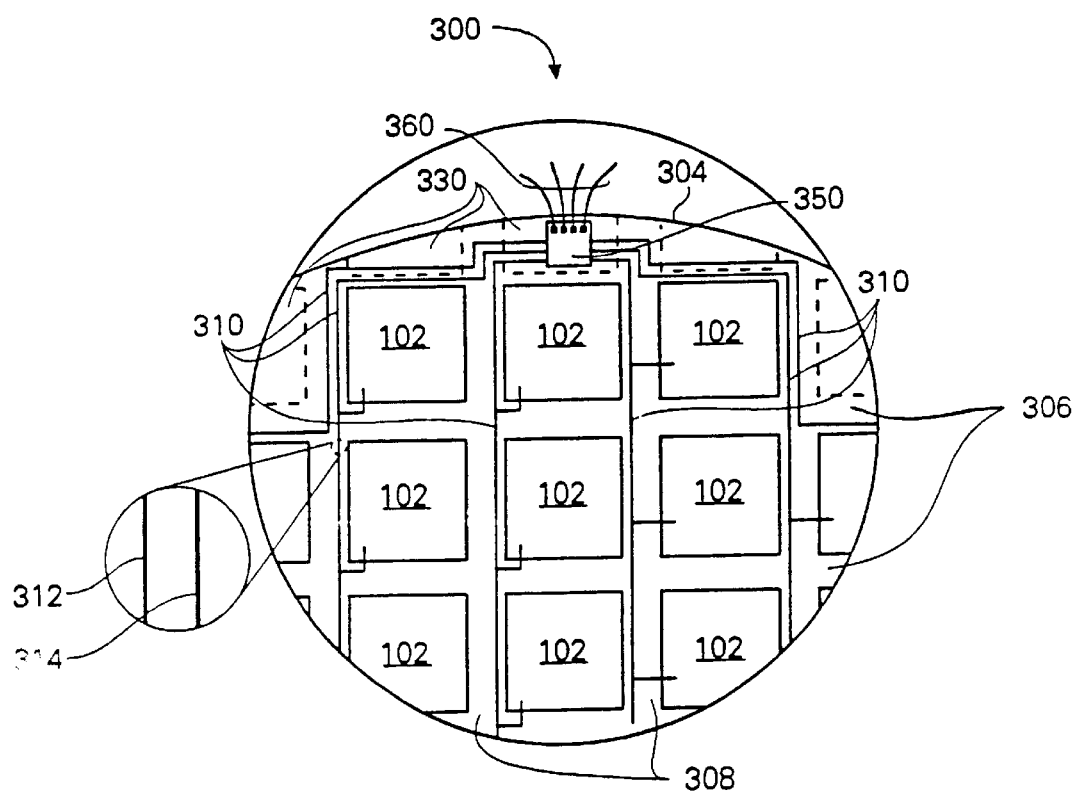
FIG. 3a–3c are diagrams of a section a wafer showing a die selection mechanism of the present mechanism.
Figure 3B:
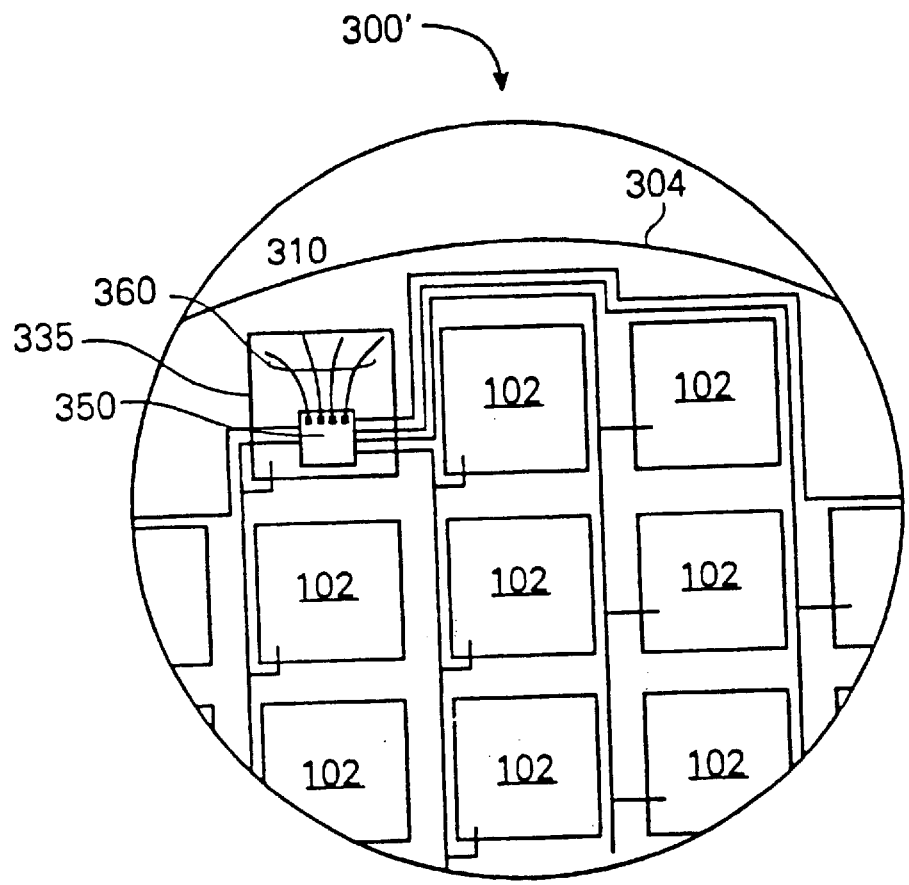

FIGS. 3a–3b

FIG. 3a shows a section 300 of a wafer (FIG. 1a) showing a portion (area) 304 of the wafer surface having a plurality of "normal" square die sites 102 (identical to the same-numbered die sites of FIG. 1a) within the interior of the wafer and a plurality of "mutant" die sites 330 in another area around the periphery of the wafer. The various die sites 102 and 330 are delineated from one another by a series of horizontal scribe lines 306 and vertical scribe lines 308. The die sites are shown artificially reduced in dimension, and the scribe lines are shown artificially enlarged in dimension, for illustrative clarity.

A plurality of sets 310 of conductive lines, each set comprising at least two conductive lines 312 and 314 (scribe line conductors), are disposed along all but a small number of parallel scribe lines 308 in a particular direction (vertical shown). These lines extend substantially entirely (chordwise) across the wafer, and terminate between adjacent mutant die sites located along half (the left half, as shown) the periphery of the wafer. These particular mutant die sites are contiguous in that while they are delineated by scribe lines, they form an uninterrupted (albeit) irregular path 320 (peripheral area) around the periphery of the wafer 304. (The same could be said of any set of adjacent mutant die sites.)

While FIG. 3a shows sets of scribe line conductors 310 running down parallel vertical scribe lines 308, the orientation of the Figure could just as easily be horizontal, with sets of scribe line conductors 310 running across horizontal scribe lines 306, instead.

As shown in FIG. 3a, one end of each pair of lines is connected to the lower right corner of the "regular" (normally shaped), circuit-containing die above the line, in a manner mimicking that shown in FIG. 2a. These lines can be connected to the dies in any suitable manner, and are suitably employed as power and ground for powering up the die for burn-in or testing.

At their upper terminus (as shown), the sets of lines 310 are all brought to a "common area" of the wafer containing a circuit 350 for "multiplexing" the sets of scribe line conductors 310 to external lines 360. As shown in FIG. 3a, the common area is a particular one of the many mutant die sites 330. However, realizing that the mutant die sites are intended to be sacrificial after singulation, the common area can extend into the scribe line area between adjacent mutant die sites and beyond, where the common area can be as large as the entire peripheral area 320.

As explained more fully with regard to FIGS. 4a–4c, below, the plurality of sets of lines terminating in the common area are "multiplexed" to a single pair of "probe" pads, for selectively connecting a given set of lines to an external power/ground source by a mechanical probe and wire.

FIG. 3b shows an alternate embodiment of the invention, illustrating a section 300', similar to 300, wherein the common area for terminating the pairs of conductors is not located on a peripheral mutant die site or in a scribe line, but rather is located at an otherwise normal (square), "dedicated" die site 335 more centrally located on the wafer, which dedicated die site 335 contains the multiplexing circuitry (350) and pads required for performing die selection on a wafer. This dedicated die site will not contain the "normal" circuitry associated with the "normal" die sites.

In the embodiments of either FIG. 3a or 3b, the common area whereat the lines terminate is provided with suitable circuitry for selecting specific lines from the plurality of sets of scribe line conductors 310 terminating in the common area. For powering up the chips and/or for signal distribution, either for burn-in or for cross-check testing, power signals and/or other electrical signals are selectively applied to one or more of a selected pair of lines. The mechanism for selectively applying power, ground, and/or signals to selected lines is discussed below. Also, in either embodiment, a suitable number of additional pads are provided in or near the common area for allowing external equipment to cause the selection of a particular pair of lines, i.e., to implement die selection on a wafer.

FIGS. 3a and 3b both show sets of conductors 310 running down each scribe line. (Of course, single conductors may also be run down scribe lines.) This is done so that each row (or column, depending upon the direction in which the scribe line of interest is running) of dies may be connected to the conductors in the scribe line on a row by row basis.

Figure 3C:
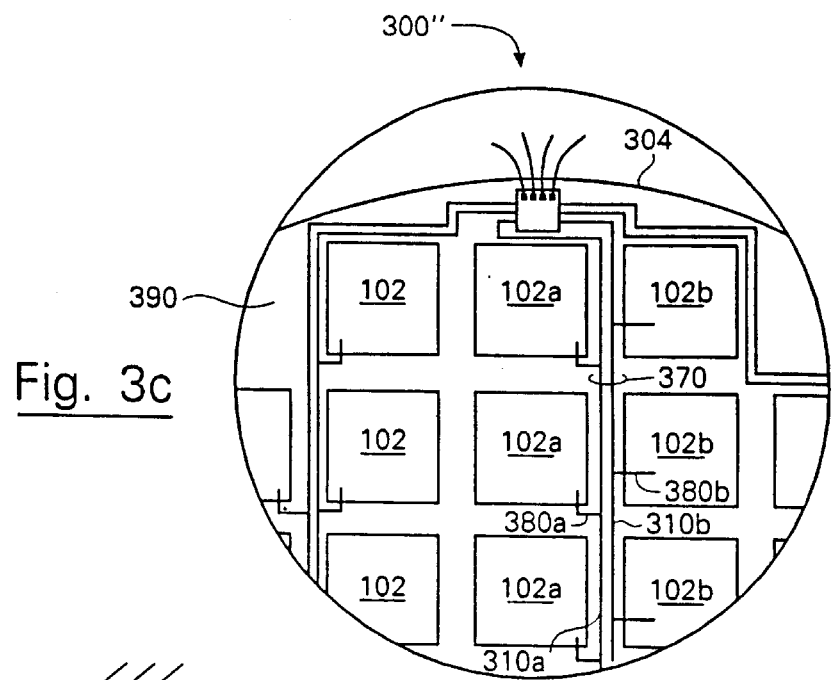

FIG. 3c shows a further alternate embodiment, whereby scribe line conductors are placed in every other vertical scribe line 308. In this manner, each row (or column) of dies may have access to the conductors in an adjacent scribe lines, but rather than accessing them all on the same side, alternating rows (or columns) of dies have access to these conductors on alternating sides of the die. That is, rather than running one set of conductors 310 down (or across) each scribe line, pairs 355 of sets of conductors 310a and 310b are run down alternating scribe lines, where one set of conductors 310a is connected to the dies 302a on one side of the scribe line and the other set of conductors 310b is connected to the dies 302b on the other side of the scribe line.

It should be noted that the line (trace) connections to dies adjacent to scribe lines (e.g. 360a and 360b) may be made via an orthogonal (to the edge of the die and to the scribe line in which runs the scribe line conductor being connected to) scribe line, as shown for trace connection 360a, or directly into the die, as shown for trace connection 360b.

Figure 4A:
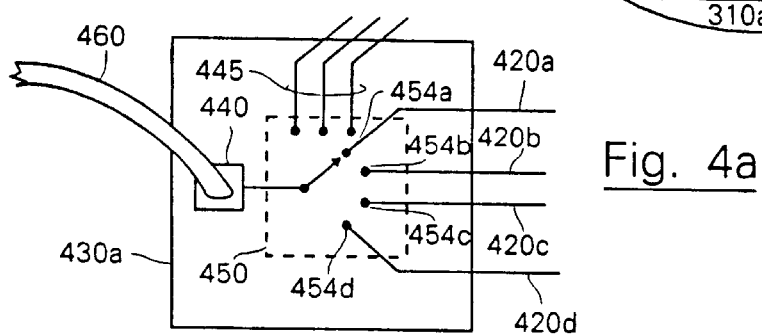
Figure 4B:
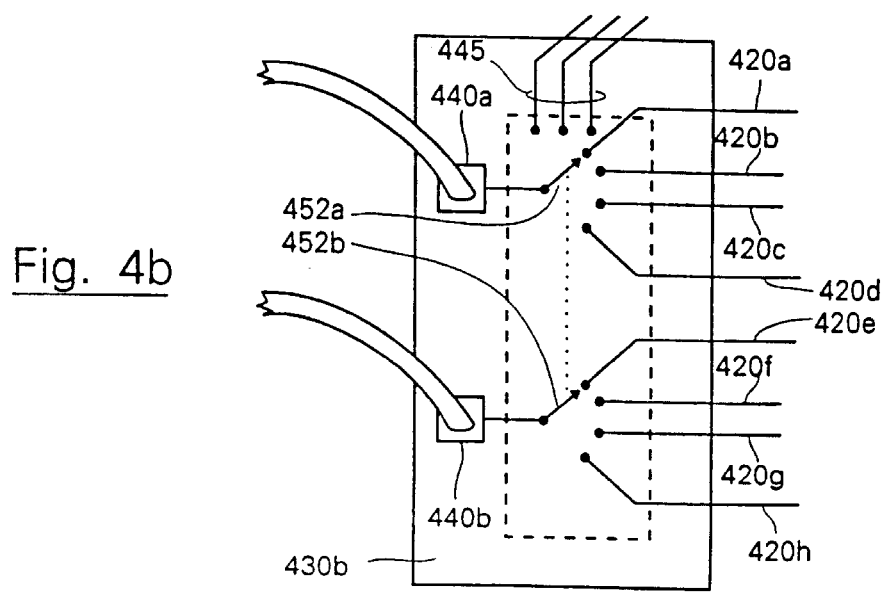

FIGS. 4a–4b

FIGS. 4a–4b show two embodiments of an electronic mechanism for "multiplexing" a plurality of sets of "n" lines (n=1, FIG. 4a; n=2, FIG. 4b) to a corresponding number of "probe" pads on the wafer. As used herein, the term "multiplexing" refers to any suitable (electronic) mechanism for effecting the desired selectability.

FIG. 4a shows a reduced (for illustrative clarity) example of multiplexing four scribe line conductors 420a, 420b, 420c, and 420d, (n=1) originating at discrete, individual dies on the wafer and terminating at a particular common area 430a (e.g., 330 FIG. 3A; 335 FIG. 3B) on the wafer. A pad 440 for connection to off-wafer equipment via a bond wire 460, and terminations of control signals 445 originating elsewhere on the wafer are also located in the common area 430a. In this example, the object is to connect to the dies, selectively, one-by-one, or row by row. In this embodiment of multiplexing circuitry, a semiconductor stepper switch 450 is formed in the common area 430a, and receives at its input an electrical signal (which may be a logic signal or a power supply connection) from an external bond wire 460 via the pad 440. The connection to pad 440 may also be made using a mechanical probe rather than a bond wire. The stepper switch has three outputs 454a, 454b and 454c, each output connected to a corresponding scribe line conductor (420a . . . d) associated with a particular individual die. In order to exercise control over which die is powered up, control signals 445 are connected to the switch 450. A suitable signal applied from elsewhere on the wafer will determine which dies are powered up.

It should be noted that the semiconductor stepper 450 may be used to connect any electrical signal, including a power supply, to the unsingulated dies. As is described below, when such signals are applied in pairs, it is possible to selectively power up dies on the wafer, the pair of scribe line conductors carrying power and ground (a larger number of scribe line conductors required for multiple supply applications) with a minimal number of control signals required.

It should also be noted that while control signals 445 are shown as originating elsewhere on the wafer in FIG. 4a, bond wire connections to external control signals via bonding pads could be made, as well.

FIG. 4b shows a reduced (for illustrative clarity) example of multiplexing four pairs of lines 420a and 422a; 420b and 422b; 420c and 422c; and 420d and 422d; (n=2) terminating at a particular common area 430b on the wafer. Pads 440a and 440b for connection to off-wafer equipment via a bond wires 460a and 460b, and terminations of control signals 445 originating elsewhere on the wafer are also located in the common area 430b. By way of example, in this manner the dies may be selectively (one-by-one) powered up, such as for static burn-in. In this embodiment of multiplexing circuitry, a semiconductor stepper switch 450 is formed in the common area, and receives at its inputs 452a and 452b power and ground applied from an external source to the two pads 440a, 440b. The stepper switch has four pairs of outputs 454a and 456a; 454b and 456b; 454c and 456c; and 454d and 456d; each output connected to a pair of lines associated with a particular die. In order to exercise control over which die is powered up, control signals 445 are connected to switch 450. Suitable signals applied to control signals 445 will determine which die is powered up.

FIGS. 5a–5g

FIGS. 5a–5h illustrate various implementations of selector switching (stepper) circuitry suitable for accomplishing the objectives of the present invention and suitable for implementing the switching arrangements similar to and in more detail than those of FIGS. 4a and 4b. In all of these Figures, signals are carried via lines originating at a "termination point". These termination points (signal origination points) may be any of the following: bonding pads, a mechanical probe point on the wafer, a signal source originating in a circuit located in a scribe line, a signal source originating in a circuit in one of the mutant die sites, a signal source originating in one of the "normal" die sites, a signal generated by an E-beam probe, or any other suitable signal source.

Figure 5A:
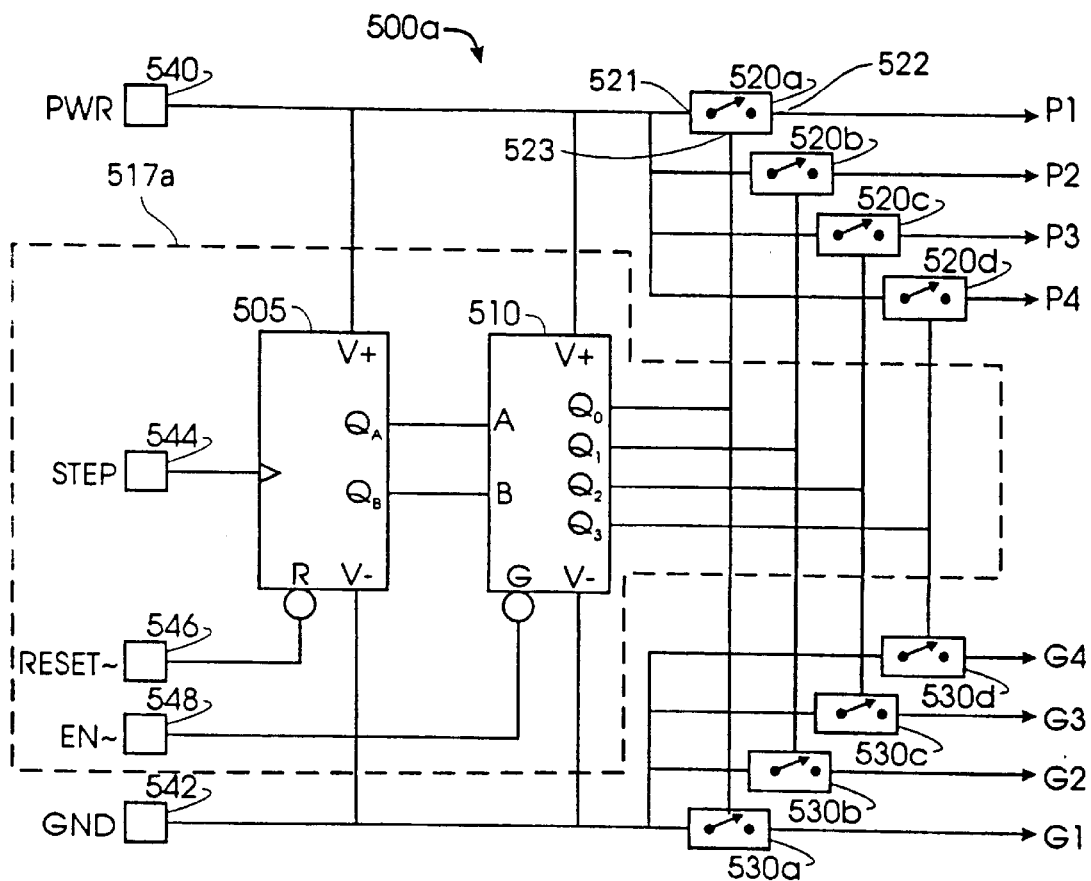
FIGS. 5a–5h are schematics of various selector switch circuits suitable for implementation of selector switches of the type shown in FIGS. 4a–4d.

FIG. 5a shows one implementation of a semiconductor stepper switch arrangement 500a functionally equivalent to that shown in FIG. 4b. In this case, the electrical signals to be "multiplexed" (selectively connected to dies) are power supply signals PWR and GND, connected via lines to termination points 540 and 542, respectively. A digital counter 505 is provided, having a positive supply connection point (V+), a negative supply connection point (V−), a clock input (indicated by ">"), a reset input (R) and two output bits $Q_A$ and $Q_B$. A reset signal is connected to the reset input of counter 505 via termination point 546. A step (count or clock) input is applied to the clock input of counter 505 via termination point 544. Power supply connections to counter 505 a provided via connections to termination points 540 (PWR) and 542 (GND). With power is applied via termination points 540 and 542, a reset signal applied to termination point 546, setting the two counter outputs to known states. After resetting the counter, each pulse applied to the clock input via termination point 544 ("STEP"), will advance the counter outputs to a new state.

A decoder 510, having power supply connection (V+ and V−), two select inputs (A and B), four decode outputs ($Q_A$, $Q_B$, $Q_C$, and $Q_D$), and an enable input (G) arriving via a line connected to termination point 548, decodes the binary states presented at select inputs A and B, and activates one of the four decode outputs if an enabling signal is present at enable input G. Power supply connections V+ and V− on decoder 510 are connected via lines to termination points 540 and 542, respectively. Select input A is connected via a line to counter output $Q_A$, and select input B is connected via a line to counter output $Q_B$. After the counter has been reset, and with an enabling input present, arriving via termination point 548 ("EN~"), each pulse applied at termination point 544 ("STEP"), one of the decoder's (510) decode outputs is activated. With each successive pulse received via termination point 544 ("STEP") a different decode output is activated and the previously activated decoder output is deactivated. The process proceeds until all decoder outputs have been activated once, at which point the sequence repeats itself. The sequence may be restarted at any time by applying a reset signal at termination point 546. The signals on lines connected to termination points 544, 546, and 548 correspond to control signals 445 with respect to FIG. 4b. (A dashed box 517a delineates a construct called a selector switch control circuit, referred to with respect to FIG. 5h)

Eight SPST (single-pole single-throw) semiconductor switches, (520a, 520b, 520c, 520d, 530a, 530b, 530c, and 530d) are provided, each having two switch connections 521 and 522, and a control input 523. Any such switch effectively provides an electrical connection across its switch connections (521 and 522) when an enabling signal is applied at its control input 523, and effectively presents an open circuit condition across its switch connection (521 and 522) when such an enabling signal is not present (switch connections 521, 522, and control input 523 are indicated only on switch 520a for illustrative clarity, but are typical of corresponding connections to the remaining switches). Switches of this type are well known in the art and may be fabricated by any of a number of manufacturing technologies and methods. Such switches are often called "analog switches". Switches having different characteristics may be fabricated favoring, for example, current flow in a particular direction, small-signal switching, or power-supply switching. Switches 520a and 530a receive an enabling input signal at their respective control inputs 523 via a line connected to decode output $Q_A$ of decoder 510. Switches 520b and 530b receive an enabling input signal at their respective control inputs via a line connected to decode output $Q_B$ of decoder 510. Switches 520c and 530c receive an enabling input signal at their respective control inputs via a line connected to decode output $Q_C$ of decoder 510. Switches 520d and 530d receive an enabling input signal at their respective control inputs via a line connected to decode output $Q_D$ of decoder 510. The designs of decoder 510 and switches 520a–d and 530a–d are such that an activated decode output on decoder 510 is received at the switch to which it is connected as an enabling control input signal. One switch connection (521) of each of switches 520a, 520b, 520c, and 520d is connected via a line to a first electrical signal in common. In this example, the first electrical signal is a positive power supply connection ("PWR") at termination point 540. One switch connection (521) of each of switches 530a, 530b, 530c, and 530d is connected via a line to a second electrical signal in common. In this example, the second electrical signal is a ground power supply connection ("GND") at termination point 542. The remaining switch connections 522 on switches 520a, 520b, 520c, and 520d, are connected on a one-to-one basis to four distribution lines (P1, P2, P3, and P4). The remaining switch connections 522 on switches 520a, 520b, 520c, and 520d, are connected on a one-to-one basis to four distribution lines (P1, P2, P3, and P4). The remaining switch connections 522 on switches 530a, 530b, 530c, and 530d, are connected on a one-to-one basis to four other distribution lines (G1, G2, G3, and G4).

As pulses are received at the clock input of counter 505, and individual decode outputs are activated on decoded 510, switches are closed in pairs, one on the pair connected to the first electrical signal ("PWR") and the other of the pair connected to the second electrical signal ("GND"). Switch 520a is paired with switch 530a by way of their control input common connection to decode output $Q_A$ of decoder 510; switch 520b is paired with switch 530b by way of their common control input connection to decode output $Q_B$ of decoder 510; switch 520c is paired with switch 530c by way of their common control input connection to decode output $Q_C$ of decoder 510; and switch 520d is paired with switch 530d by way of their common connection to decode output $Q_D$ of decoder 510.

The enable signal on termination point 548 effectively activates whichever decode output on decoder 510 is selected by the states of the counter outputs of counter 505, thus turning on (closing) the pair of switches 530'x' and 520'x' whose control inputs are connected to the activated decoder output. When the enabling signal is removed, all decoder outputs are deactivated, opening all switches 520'x' and 530'x'. In this manner, a semiconductor dual-pole stepper switch with four positions (DP4T) is formed, performing a function analogous to a mechanical stepper switch. Arbitrarily large semiconductor stepper switches can be made by providing counters and decoders having greater numbers of counter outputs and select inputs, respectively, and correspondingly larger numbers (exponentially proportional) of decoder outputs; and by providing correspondingly larger numbers of switches.

Hereinafter, a notational convention will be used for Figure references numbers such that 'x' in a reference number means that the reference is to any and all references where 'x' may be replaced by a letter. That is, where (arbitrarily for this example) reference numbers 520a, 520b, 520c, and 520d may be referred to collectively as 520'x'.

Figure 5B:
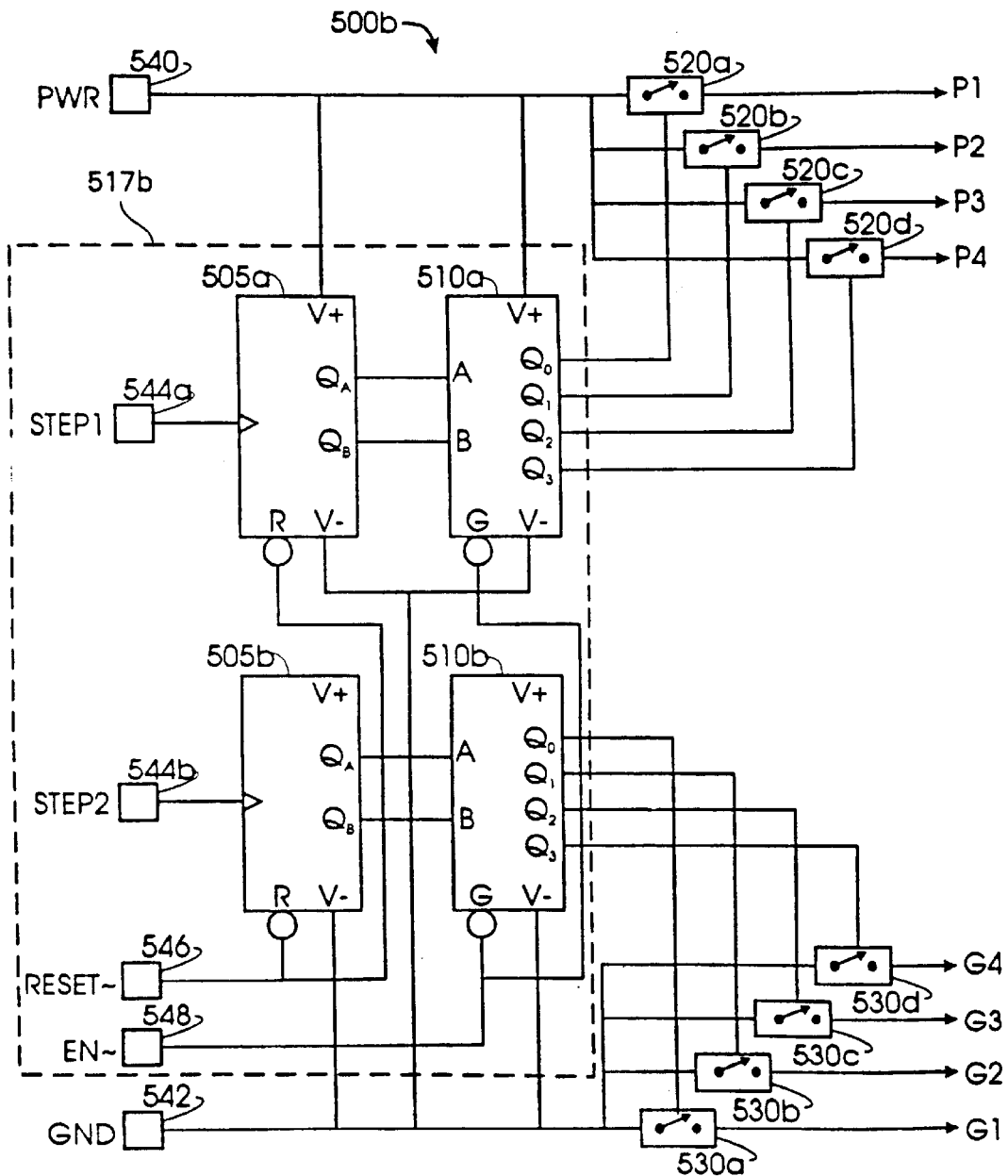

FIG. 5*b* shows a switching arrangement 500*b* similar to 500*a*, where switches 520'*x*'; and switches 530'*x*' may be switched independently. (A dashed box 517*b* delineates a construct called a selector switch control circuit, referred to with respect to FIG. 5*h*). This is accomplished by providing separate counters 505*a* and 505*b* (similar to counter 505), and separate decoders 510*a* and 510*b* (similar to decoder 510), where counter 505*a* and decoder 510*a* control switches 520'*x*'; and counter 505*b* and decoder 510*b* control switches 530'*x*'. Counter 505*a* has a signal "STEP1" at its clock input, connected via a line to termination point 544*a*. Counter 505*b* has a signal "STEP2" at its clock input, arriving via a line to termination point 544*b*. the reset inputs of counters 505*a* and 505*b* are connected in common to a reset signal "RESET~" via a line to termination point 546. The enable inputs of decoders 510*a* and 510*b* receive, in common, an enable signal "EN~" via a line connected to termination point 548. Positive power supply connections to counters 505'*x*' and decoders 510'*x*' are made in common via a line connected to termination point 540. Negative power supply connections to counters 505'*x*' and 510'*x*' are made in common via a line connected to termination point 542. Counter outputs $Q_A$ and $Q_B$ of counter 505*a* connect to select inputs A and B, respectively, of decoder 510*a*. Counter outputs $Q_A$ and $Q_B$ of counter 505*b* connect to select inputs A and B, respectively, of decoder 510*b*. The $Q_0$ output of decoder 510*a* connects via a line to the control input of switch 520*a*; the $Q_1$ output of decoder 510*a* connects via a line to the control input of switch 520*b*; the $Q_2$ output of decoder 510*a* connects via a line to the control input of switch 520*c*; and the $Q_3$ output of decoder 510*a* connects via a line to the control input of switch 520*d*. The $Q_0$ output of decoder 510*b* connects via a line to the control input of switch 530*a*; the $Q_1$ output of decoder 510*b* connects via a line to the control input of switch 530*b*; the $Q_2$ output of decoder 510*b* connects via a line to the control input of switch 530*c*; and the $Q_3$ output of decoder 510*b* connects via a line to the control input of switch 530*d*.

Switch closures for this switching arrangement are selected in much the same manner as for that of FIG. 5*a*, except that after resetting, the number of pulses received at the clock input of counter 505*a* ("STEP1" signal) controls which switch 520'*x*' is closed, while the number of pulses received at the clock input of counter 505*b* ("STEP2" signal) controls which switch 530'*x*' is closed.

Figure 5C:
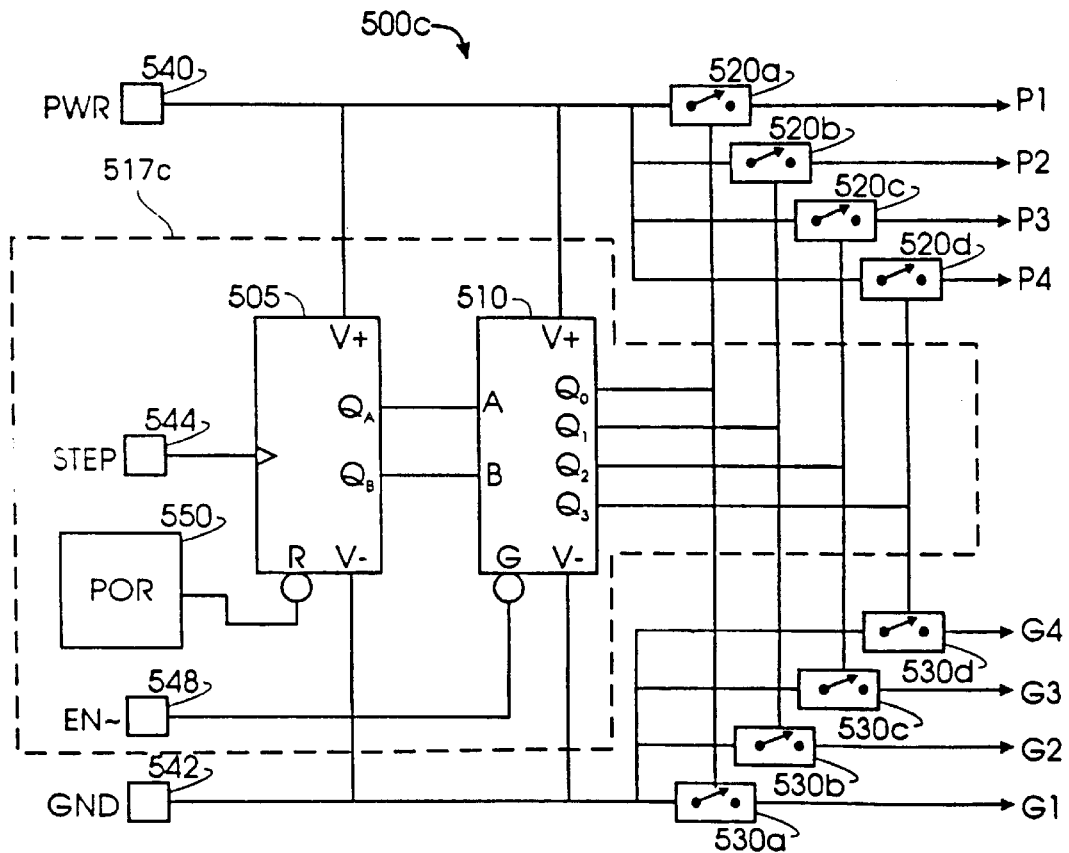

FIG. 5*c* shows a switching arrangement 500*c*, similar to 500*a* (FIG. 5A), identical in all regards except that the reset signal of counter 505 is connected to a Power-ON-Reset module (POR) 550. POR module 550 contains a circuit for generating a reset pulse whenever power is applied. (A dashed box 517*c* delineates a construct called a selector switch control circuit, referred to with respect to FIG. 5*h*). Circuits for this type of module are well known in the present art and are in wide use. If it is desirable that the reset pulse from module 550 be generated independently of the power signals at termination points 540 and 542, it may be powered instead from another power source.

Figure 5D:
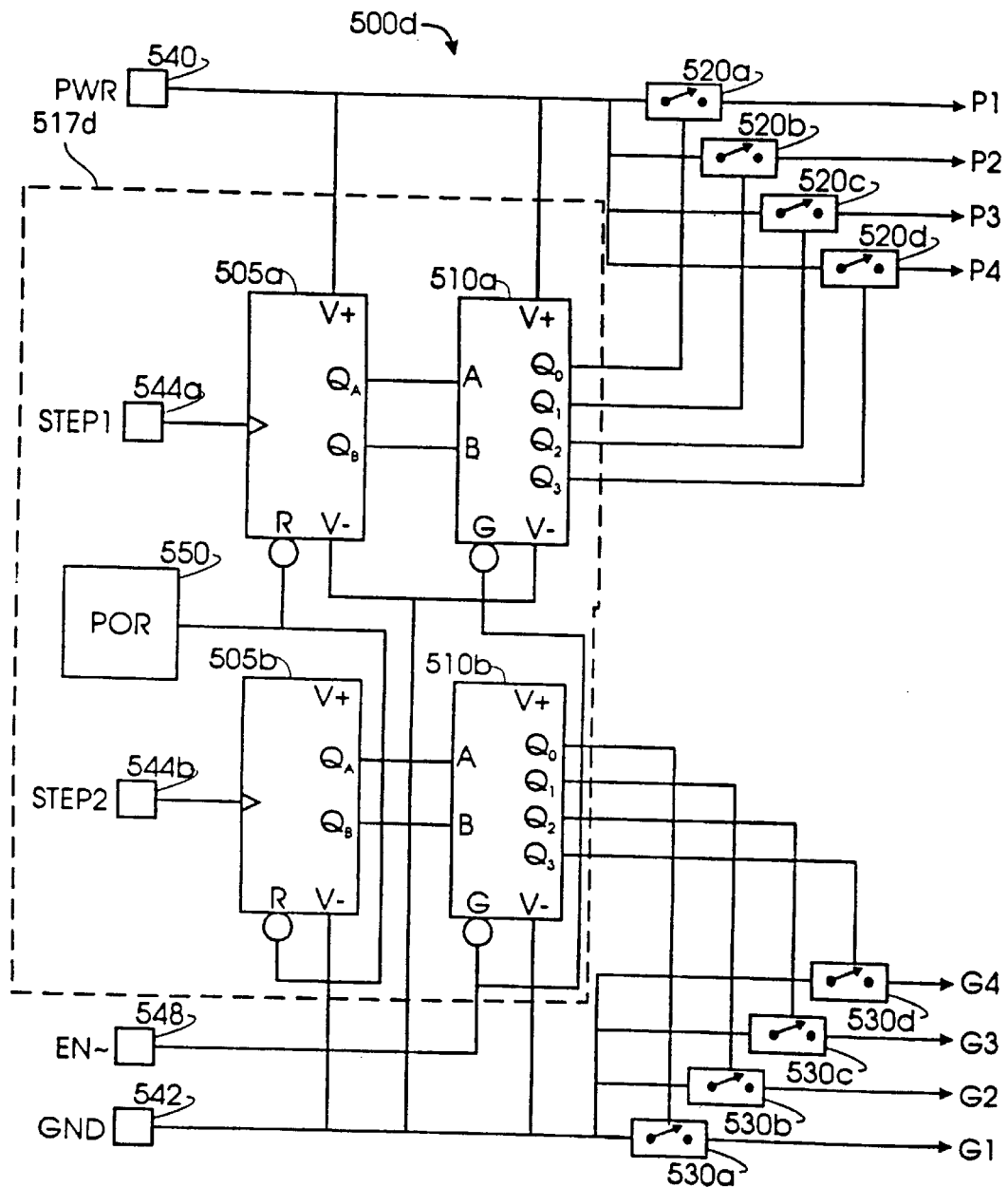

FIG. 5*d* shows a switching arrangement 500*d*, similar to 500*b* (FIG. 5B), identical in all regards except that the reset signals to counters 505*a* and 505*b* are connected to a Power-ON-Reset module (POR) 550, in similar fashion to the switching arrangement 500*c*. (A dashed box 517*d* delineates a construct called a selector switch control circuit, referred to with respect to FIG. 5*h*).

Figure 5E:
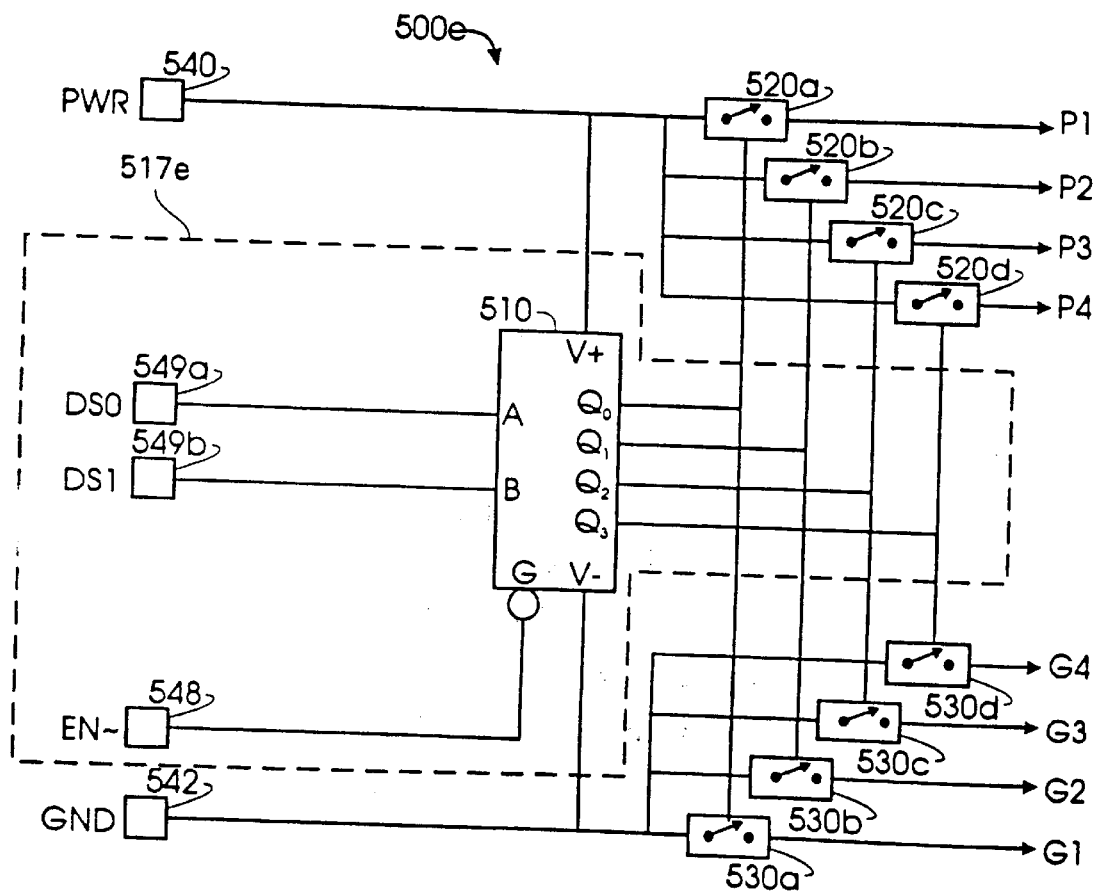

FIG. 5*e* shows an alternate selector switching arrangement 500*e*, wherein switches 520'*x*' and 530'*x*' may be closed in predetermined pairs, but where no counter is provided. (A dashed box 517*e* delineates a construct called a selector switch control circuit, referred to with respect to FIG. 5*h*). The A and B select inputs of counter 510 are connected directly via lines to external control signals DS0 and DS1 at termination points 549*a* and 549*b*. By applying appropriate control signals DS0 and DS1 to this circuit, pre-determined pairs of switches may be closed at random, one pair at a time.

Figure 5F:
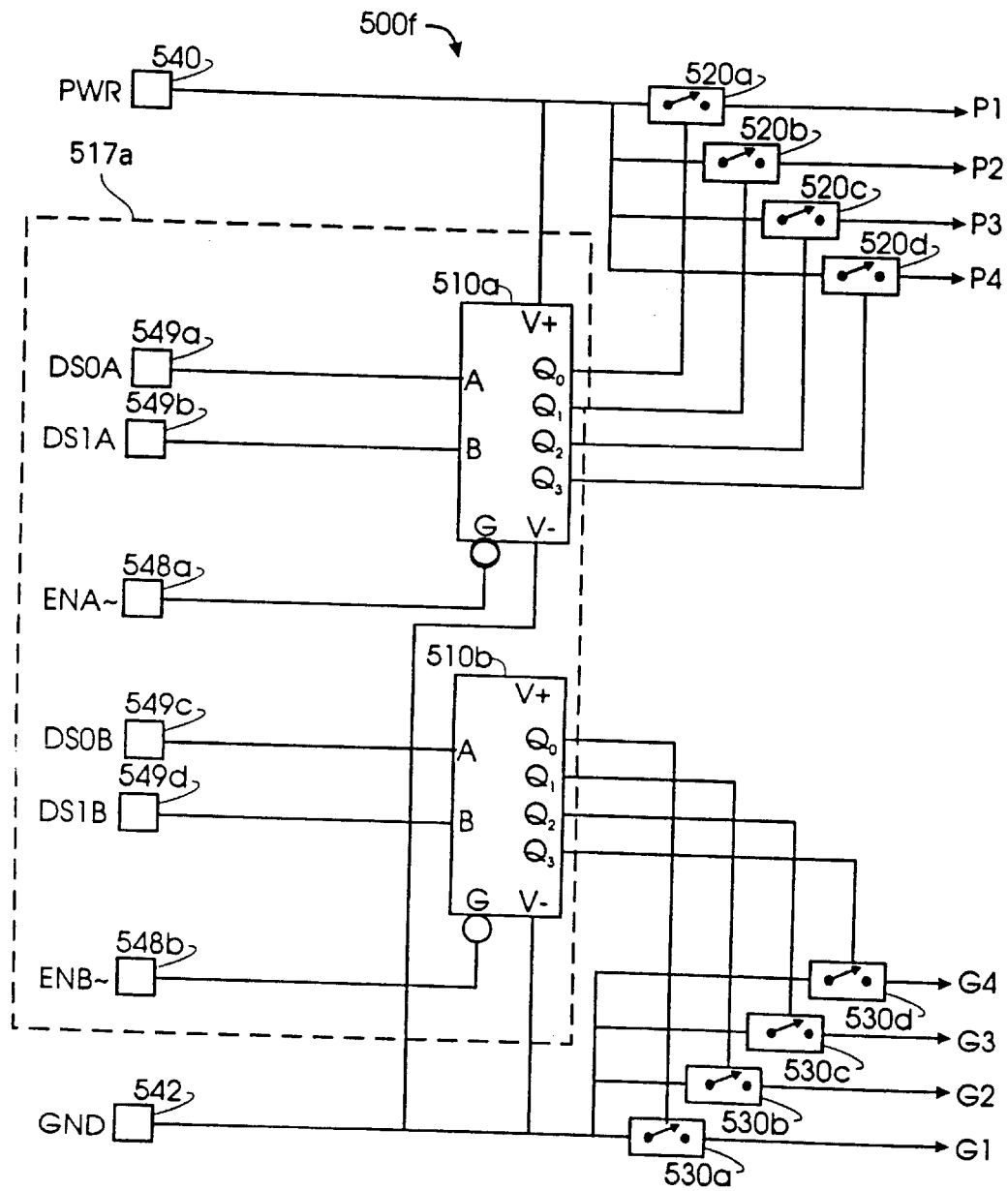

FIG. 5*f* shows an alternate selector switching arrangement 500*f*, similar to 500*e*, wherein individual closures of switches 520'*x*' and 530'*x*' may be selected independently and at random. (A dashed box 517*f* delineates a construct called a selector switch control circuit, referred to with respect to FIG. 5*h*). Connections between decoder 510*a* and switches 520'*x*' and between decoder 510*b* and switches 530'*x*' are identical to corresponding connections in FIGS. 5*b* and 5*d*. Select inputs A and B of decoder 510*a* receive control signals "DS0A" and "DS1A", respectively via lines to termination points 549*a* and 549*b*, respectively. Select inputs A and B of decoder 510*b* receive control signals "DS0B" and "DS1B", respectively via lines to termination points 549*c* and 549*d*, respectively. In this case, however, separate enable signals "ENA~" and "ENB~" are provided at the enable inputs of decoders 510*a* and 510*b*, respectively, via lines terminating at termination points 548*a* and 548*b*, respectively.

Suitable control signals at "DS0A" and "DS1A" at the select inputs A and B of decoder 510*a*, in the presence of an enabling signal at the enable input (G) of decoder 510*a*, determine which one of switches 520'*x*' will be closed. Suitable control signals at "DS0B" and "DS1B" at the select inputs A and B of decoder 510*b*, in the presence of an enabling signal at the enable input (G) of decoder 510*b*, determine which one of switches 530'*x*' will be closed.

If the enabling signal ("ENA~") at the enable input (G) of decoder 510*a* is removed, then all of switched 520'*x*' will be opened. Likewise, if the enabling signal ("ENB~") at the enable input (G) of decoder 510*b* is removed, then all of switched 530'*x*' will be opened.

Figure 5G:
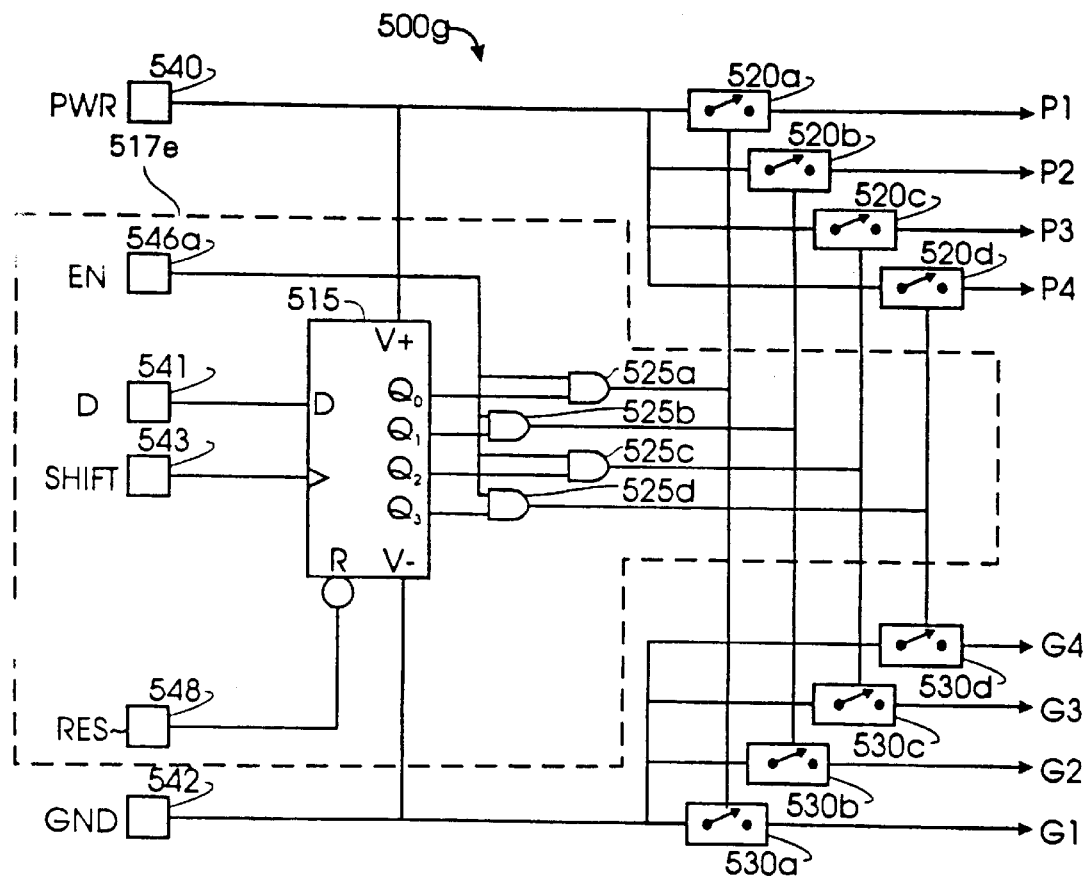

FIG. 5*g* shows another alternate switching arrangement 500*g*, similar to 500*e*, wherein a shift register 515 is employed rather than a decoder for the purpose of closing (activating) selected switches 520'*x*' and 530'*x*'. (A dashed box 517*g* delineates a construct called a selector switch control circuit, referred to with respect to FIG. 5*h*). Additionally, four logic AND gates 525*a*, 525*b*, 525*c*, and 525*d*, are provided, each having two inputs and one output. Shift register 515 has a data input (D), a reset input (R), a clock input (>), a positive power supply connection (V+), a negative power supply connection (V−) and four outputs ($Q_0, Q_1, Q_2, Q_3$). The data input of shift register 515 receives a data signal DI via a line connected to termination point 541. The clock input receives a shift input signal ("SHIFT") via a line connected to termination point 543. The reset input (R) receives a reset signal ("RES~") via a line connected to termination point 548. Shift register 515 receives its positive power supply (V+) and negative power supply (V−) connections via lines connected to termination points 540 and 542, respectively.

The $Q_0$ output of shift register 515 is connected to one input of AND gate 525*a*, the $Q_1$ output of shift register 515 is connected to one input of AND gate 525*b*, the $Q_2$ output of shift register 515 is connected to one input of AND gate 525*c*, and the $Q_3$ output of shift register 515 is connected to one input of AND gate 525*d*. The remain inputs on AND gates 525'*x*' are connected in common to an enabling signal ("EN") via a line to termination point 546*a*. The output of AND gate 525a is connected to the control input of gates 520a and 530a, such that when the output of gate 525a is asserted, switches 520a and 530a are turned on (closed). The output of AND gate 525b is connected to the control input of gates 520b and 530b, such that when the output of gate 525b is asserted, switches 520b and 530b are turned on (closed). The output of AND gate 525c is connected to the control input of gates 520c and 530c, such that when the output of gate 525c is asserted, switches 520c and 530c are turned on (closed). The output of AND gate 525d is connected to the control input of gates 520d and 530d, such that when the output of gate 525d is asserted, switches 520d and 530d are turned on (closed).

The $Q_0$, $Q_1$, $Q_2$, and $Q_3$ outputs of shift register 515 are controlled by serially clocking in data signals received at the data input (D) of shift register 515, by presenting a suitable clock signal at the clock input (>) of shift register 515. In this way, any combination of shift register outputs may be asserted.

By this selector switch arrangement, 500g, it is possible to close (turn on) selected predetermined pairs of switches 520'x' and 530'x', either one pair at a time or in combinations of pairs. When an enabling input is present at termination point 546a, switches 520'x' and 530'x' are closed as follows: switches 520a and 530a are closed if the $Q_0$ output of shift register 515 is asserted (active, on, TRUE); switches 520b and 530b are closed if the $Q_1$ output of shift register 515 is asserted; switches 520c and 530c are closed if the $Q_2$ output of shift register 515 is asserted; and switches 520d and 530d are closed if the $Q_2$ output of shift register 515 is asserted. If the enabling input is not present at termination point 546, all of switches 520'x' and 530'x' are open (turned off).

FIGS. 5a–5g all show a common connection between one switch contact of switches 520'x' and the positive power supply connections (V–) of one or more circuit blocks, and another common connection between one switch contact of switches 530'x' and the negative power supply connections of these same circuit blocks. This connection is particularly convenient when the switching arrangements shown are used to power individual dies or sets of dies. However, according to the invention, if the circuit blocks connected in common to the commonly connected sides of switches 520'x' and 530'x' are disconnected from these points and are powered independently, then the switching arrangements disclosed may be used to switch any suitable electrical signals merely by connecting them in place of PWR and GND to termination points 540 and 542, respectively. In this manner, the switching arrangements are generalized such that they may be used to make any desired controllable connection such as: connections of external signals to dies, die to die signal connections, or connections to signal generating circuits.

Figure 5H:
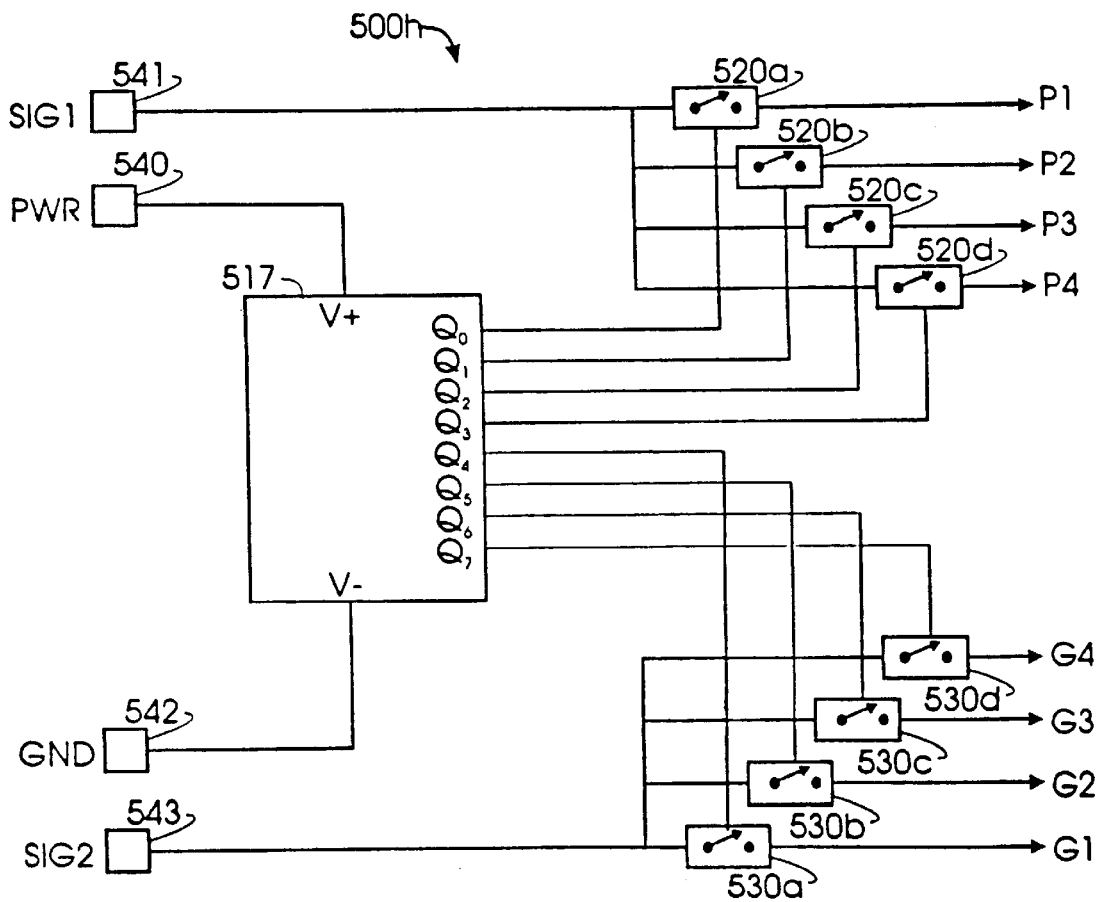

FIG. 5h illustrates this generalization. A suitable selector switch control circuit 517h, such as 517a–517g, has a positive power supply input, a negative power supply input, and a sufficient number of outputs to connect to the control inputs of switches 520'x' and 530'x' on a one-to-one basis (eight, in this case, as shown). Although not shown, some of these outputs may be common internal to selector switch control circuit 517h (as is the case if a selector switch such is independently powered by power supply signals PWR and GND carried on lines to termination points 540 and 542, respectively. Outputs ($Q_0$–$Q_7$) of selector switch control circuit 517h are connected on a one to one basis to the control inputs of switches 520'x' and 520'x' according to a predetermined connection schema (e.g., if the circuit of 517a is used for 517h, then connections from 517h to the control inputs of switches 520'x' and 530'x' are made according to the connection strategy for 517a as shown in FIG. 5a.). One side of switches 520'x' is connected in common to a termination 541 whereat a signal "SIG1" originates. One side of switches 530'x' is connected in common to a termination point 543, whereat a signal "SIG2" originates. The remaining connections to switches 520'x' and 530'x' are the same as for FIGS. 5a–5g. In this manner, switches 520'x' selectively distribute signal "SIG1", and switches 530'x' selectively distribute "SIG2".

FIGS. 6a–6f

Figure 6A:
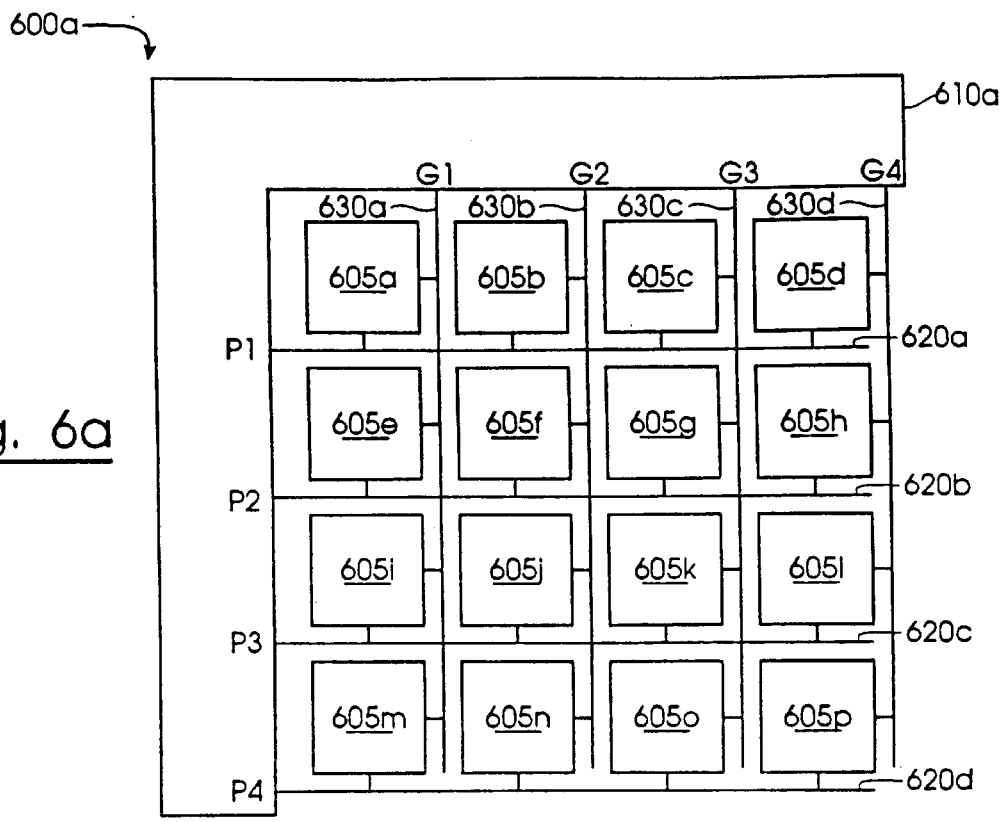
FIGS. 6a–6f are diagrams of die selection employing the techniques of the present invention.
Figure 6B:
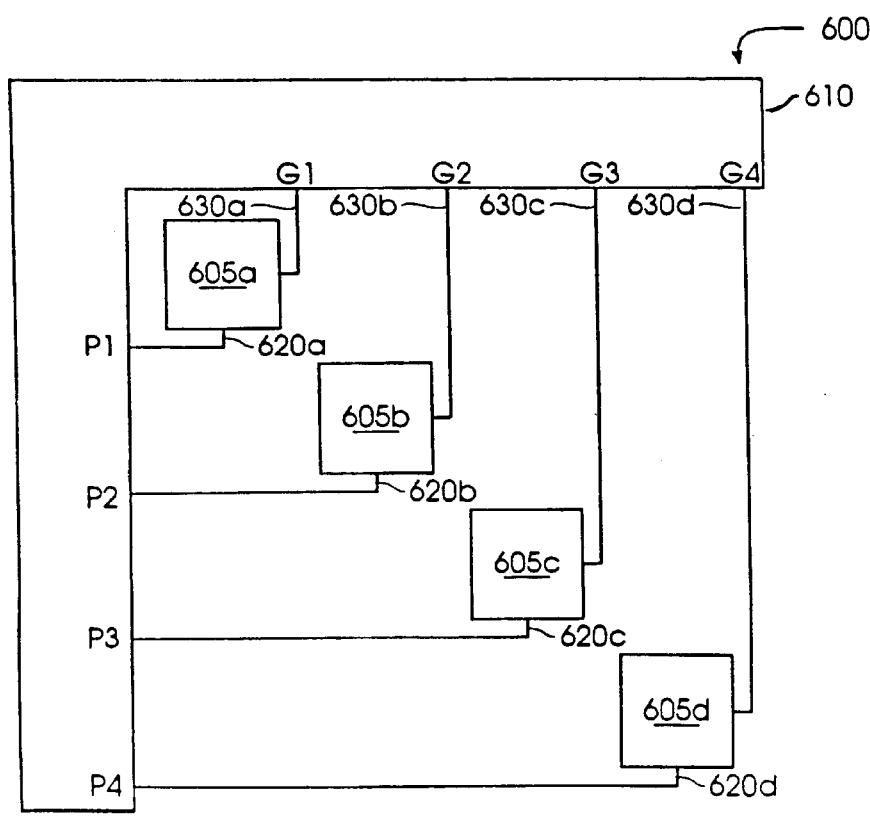
Figure 6C:
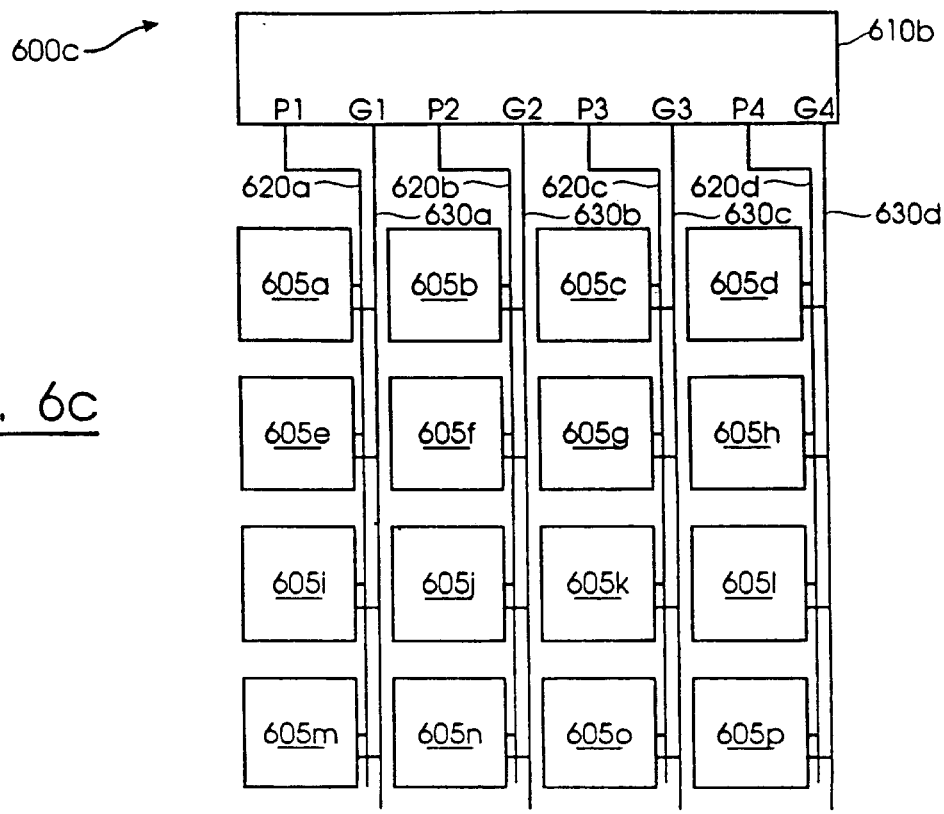

Having established a mechanism for creating selector switching arrangements whereby specific combinations of lines may be selectively connected to selected signals, a need still exists to use this type of switching arrangement to advantage for the purpose of selecting and/or selectively distributing signals to individual dies and/or groups of dies. FIGS. 6a–6c show how this is accomplished.

FIG. 6a shows apparatus 600a for implementing one embodiment of the present invention as it relates to die selection on a wafer. A selector switch 610a is provided, having a plurality of switch outputs (8 shown) G1, G2, G3, and G4 connected to lines 630a, 630b, 630c, and 630d, respectively, and switch outputs P1, P2, P3, and P4 connected to lines 620a, 620b, 620c, and 620d, respectively. While only 8 switches and switch outputs (signal distribution lines) are shown, the technique may be used for an arbitrarily large number of switches and lines. Internally, selector switch 610a may be configured as any appropriate switching circuit where two outputs may be activated at once; one of the two switch outputs so activated is one of the group G1, G2, G3, and G4; the other of the two switch outputs so activated is one of the group P1, P2, P3, and P4; and where the particular selections of outputs to be activated in each group may be made independently (i.e., there is no particular pairing of outputs). Examples of suitable such circuits 610a are given in FIGS. 5b, 5d, and 5f.

A plurality of dies 605a–p (16 shown) are arranged in a logical pattern of rows and columns. (Note that a "logical pattern" is a pattern developed for notational convenience and ease of understanding, as opposed to a "physical pattern" indicating physical orientation.) FIG. 6a is intended to show the relationships of selector switch 610a and dies 605a–p schematically. For illustrative clarity, the dies 605a–p are shown physically arranged in rows and columns, but their physical arrangement need not necessarily follow their logical pattern shown in the figure.

Line 630a connects to all of the dies (605a, 605e, 605i, and 605m) in one column; line 630b connects to all of the dies (605b, 605f, 605j, and 605n) in another column; line 630c connects to all of the dies (605c, 605g, 605k, and 605o) in another column; and line 630d connects to all of the dies (605d, 605h, 605l, and 605p) in another column.

Line 620a connects to all of the dies (605a, 605b, 605c, and 605d) in one row; line 620b connects to all of the dies (605e, 605f, 605g, and 605h) in another row; line 620c connects to all of the dies (605i, 605j, 605k, and 605l) in another row; and line 620d connects to all of the dies (605m, 605n, 605o, and 605p) in another row.

For any pair of lines where one of the pair is one of lines 620a, 620b, 620c, and 620d, and the other of the pair is one of lines 630a, 630b, 630c, and 630d, there is only one die 605'x' (where 'x' may be a, b, c, d, e, f, g, h, i, j, k, l, m, n, o, or p) which is connected to both of the pair of lines. If, for example, lines 620'x' and 630'x' designed to carry power and ground electrical signals respectively to corresponding power and ground lines on dies 605'*x*', then when such a pair of lines is activated, only one of dies 605'*x*' will have power carried to it on those lines. In this way, dies may be selectively powered by providing appropriate control signals to selector switch 610*a*, as described previously with regard to FIGS. 5*a–f*.

Alternatively, logical die selection signals may be carried on lines 620'*x*' and 630'*x*' rather than power and ground signals. In this case, for any pair of lines 620'*x*' and 630'*x*' which are activated (asserted, turned "on", selected, etc.) only one die will be connected to both of the lines so activated. A die may incorporate special test gating circuitry such that it will recognize itself as being "selected" only if both of its inputs connected to lines 630'*x*' and 620'*x*' are activated.

FIG. 6*b* shows an alternate embodiment 600*b* of die selection on a wafer wherein, a selector switch 610*b* capable of enabling discrete pairs output lines is provided. Suitable circuitry for such a selector switch 610*b* is given in FIGS. 5*a*, 5*c*, 5*e*, and 5*g*. Selector switch 610*b* is arranged such that only one pair of outputs may be activated at a time, and the pairing of activated outputs is fixed. That is, outputs G1 and P1 may be activated together, outputs. G2 and P2 may be activated together, outputs G3 and P3 may be activated together, and outputs G4 and P4 may be activated together only these pairs of outputs may be activated. Each such pair of outputs is connected to one or more dies (only one shown in FIG. 6*b* for illustrative clarity), but no two pairs of outputs are connected to any dies in common. To this end, outputs P1 and G1 are shown connected via lines 620*a* and 630*a*, respectively, to die 605*a;* outputs P2 and G2 are connected via lines 620*b* and 630*b*, respectively, to die 605*b*, outputs P3 and G3 are connected via lines 620*c* and 630*c*, respectively, to die 605*c*, and outputs P4 and G4 are connected via lines 620*d* and 630*d*, respectively, to die 605*d*.

If, for example, internal connections to selector switch 610*b* are arranged to provide power and ground electrical connections (of which the circuit of FIG. 5*b* is exemplary) then for each pair of lines 630'*x*' and 620'*x*' activated by selector switch 610*b*, a selected set of dies will be activated (only one shown for each pair in FIG. 6*b*).

FIG. 6*c* shows die selection in groups of dies. "Groups" may be rows, columns, or other selection of a small number of dies. A selector switch 610*b* (identical to that of FIG. 6*b*, but re-arranged for illustrative clarity) is provided such that outputs P1 and G1 of selector switch 610*b* on lines 620*a* and 630*a*, respectively, connect to each of dies 605*a*, 605*e*, 605*i*, and 605*m;* outputs P2 and G2 of selector switch 610*b* on lines 620*b* and 630*b*, respectively, connect to each of dies 605*b*, 605*f*, 605*j*, and 605*n;* outputs P3 and G3 of selector switch 610*b* on lines 620*c* and 630*c*, respectively, connect to each of dies 605*c*, 605*g*, 605*k*, and 605*o;* and outputs P4 and G4 of selector switch 610*b* on lines 620*d* and 630*d*, respectively, connect to each of dies 605*d*, 605*h*, 605*l*, and 605*p*. This Figure illustrates a case of die selection using groups of "n" lines, where n=2. Each group of dies is selected by a pair of lines (n=2). Other embodiments may use other numbers of lines. When lines 620*a* (P1) and 630*a* (G1) are asserted, dies 605*a*, 605*e*, 605*i*, and 605*m* are selected. When lines 620*b* (P2) and 630*b* (G2) are asserted, dies 605*b*, 605*f*, 605*j*, and 605*n* are selected. When lines 620*c* (P3) and 630*c* (G3) are asserted, dies 605*c*, 605*g*, 605*k*, and 605*o* are selected. When lines 620*d* (P4) and 620*d* (G4) are asserted, dies 605*d*, 605*h*, 605*l*, and 605*p* are selected.

The die selection configurations shown in FIGS. 6*a–6c* are particularly well suited to selectively powering dies. If the signals being switched 620'*x*' and 630'*x*' are power and ground, respectively, then the die selection occurs via powering of the dies.

However, in cases where power application is not to be the primary die selection mechanism, another approach is possible. All of the previous selection mechanism have used semiconductor switches to "pass-through" signals to selected lines. If all of the dies are to be powered at once, and die selection is to occur through the use of a logical selection scheme, then it is possible to use simpler circuitry to accomplish this.

Figure 6D:
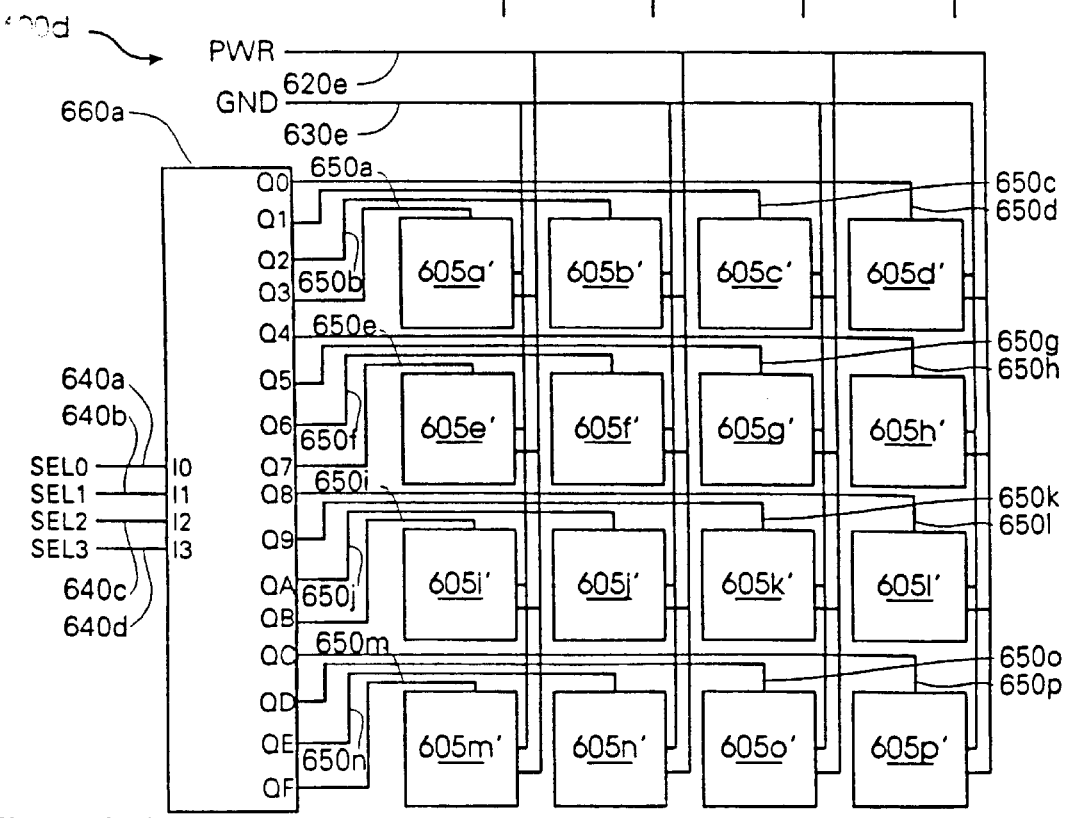

FIG. 6*d* shows one such scheme. A mechanism 600*d* for selecting any of individual dies 605*a*', 605*b*', 605*c*', 605*d*', 605*e*', 605*f*', 605*g*', 605*h*', 605*i*' 605*j*', 605*k*', 605*l*', 605*m*', 605*n*', 605*o*', or 605*p*', is accomplished using a decoder 660*a*. Each such die is similar to dies 605'*x*' in FIGS. 6*a–6c*, but is designed to accept a selection signal. All of the dies are powered in parallel by way of common power and ground connections to "PWR" (line 620*e*) and "GND" (line 630*e*). Decoder 660*a* activates one of its outputs (Q0–Q15) on the output line connected thereto 650'*x*' in response to the combination of die address inputs 640*a–d* (SEL0-3) received at its I0, I1, I2, and I3 select inputs. In the Figure, the Q'*x*' outputs of decoder 660*a* are connected as follows: output Q0 is connected via die select line 650*d* to die 605*d*', output Q1 is connected via die select line 650*c* to die 605*c*', output Q2 is connected via die select line 650*b* to die 605*b*', output Q3 is connected via die select line 650*a* to die 605*a*', output Q4 is connected via die select line 650*h* to die 605*h*', output Q5 is connected via die select line 650*g* to die 605*g*', output Q6 is connected via die select line 650*f* to die 605*f*', output Q7 is connected via die select line 650*e* to die 605*e*', output Q8 is connected via die select line 650*l* to die 605*l*', output Q9 is connected via die select line 650*k* to die 605*k*', output QA is connected via die select line 650*j* to die 605*j*', output QB is connected via die select line 650*i* to die 605*i*', output QC is connected via die select line 650*p* to die 605*p*', output QD is connected via die select line 650*o* to die 605*o*', output QE is connected via die select line 650*n* to die 605*n*', and output QF is connected via die select line 650*m* to die 605*m*'. In this way, individual dies may be "addressed" by the "SEL0", "SEL1", "SEL2", and "SEL3" die address signals.

The decoding in FIG. 6*a* is accomplished such that each die has a discrete wire going to it. Each wire is activated for only one specific combination of the SEL'*x*' die address signals.

Figure 6E:
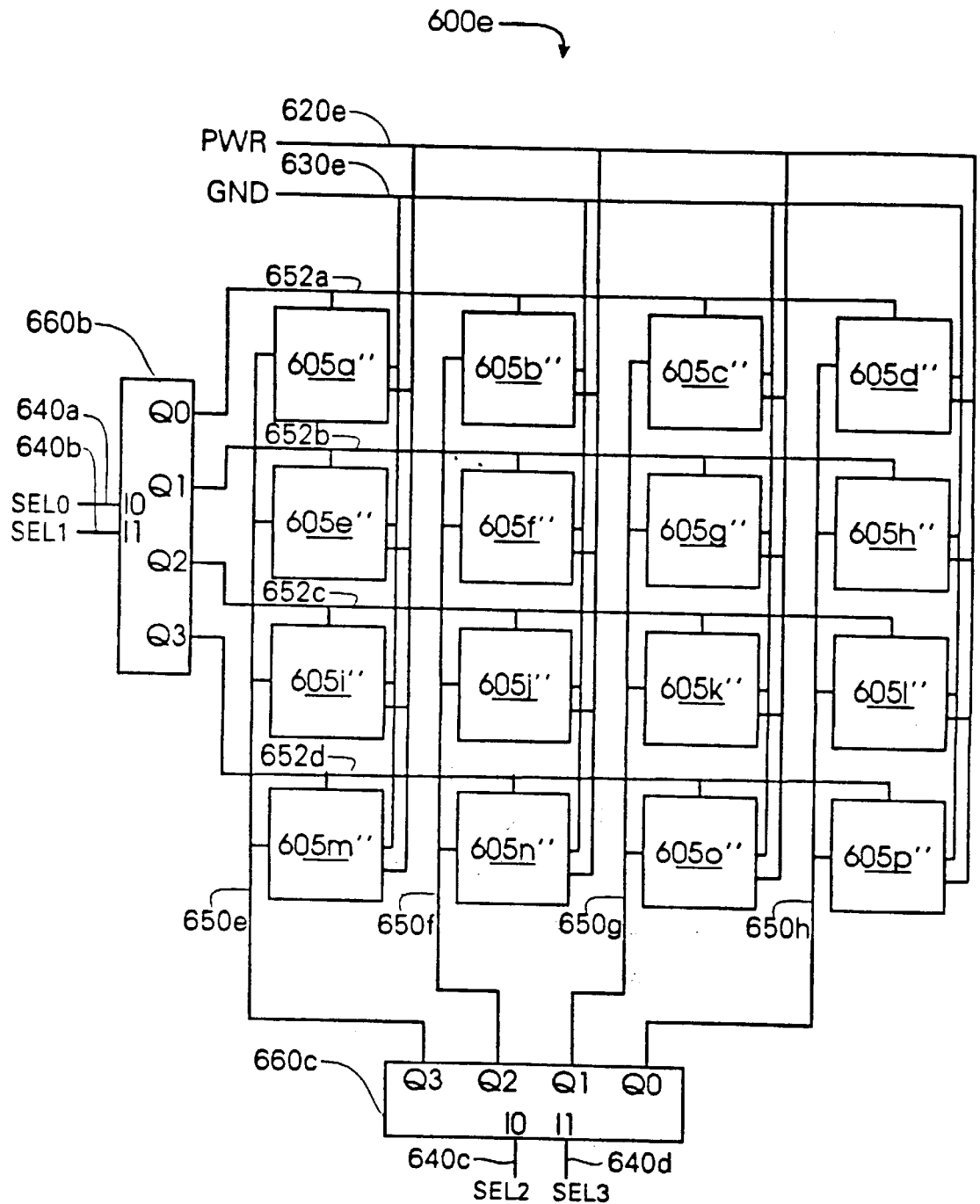

FIG. 6*e* shows an alternate approach for accomplishing the same objective, but using lines. Rather than providing one select line for each die, a "row-column" matrix approach is taken. Two decoders, 660*b* and 660*c*, each similar to 660*a* (FIG. 6*d*) but designed to decode fewer inputs, are provided. Each die is similar to dies 605'*x*' in FIGS. 6*a–6c*, but is designed to accept two select inputs, and to respond only when both are activated. Decoder 660*b* receives address signal "SEL0" on line 640*a* and address signal "SEL1" on line 640*b*. It decodes the logic states of these select inputs into four outputs: output Q0, which connects in common via die select line 652*a* to one select input of dies 605*a*", 605*b*", 605*c*", and 605*d*"; output Q1, which connects in common via die select line 652*b* to one select input of dies 605*e*", 605*f*", 605*g*", and 605*h*"; output Q2, which connects in common via die select line 652*c* to one select input of dies 605*i*", 605*j*", 605*k*", and 605*l*"; and output Q3, which connects in common via die select line 652*d* to one select input of dies 605*m*", 605*n*", 605*o*", and 605*p*". Decoder 660*c* receives address signal "SEL2" on line 640*c* and address signal "SEL3" on line 640*d*. It decodes the logic states of these select inputs into four outputs: output Q0, which connects in common via die select line 652*h* to the other select input of dies 605*d"*, 605*h"*, 605*l"*, and 605*p"*; output Q1, which connects in common via die select line 652*g* to the other select input of dies 605*c"*, 605*g"*, 605*k"*, and 605*o"*; output Q2, which connects in common via die select line 652*f* to the other select input of dies 605*b "*, 605*f"*, 605*j"*, and 605*n"*; and output Q3, which connects in common via die select line 652*e* to the other select input of dies 605*a"*, 605*e"*, 605*i"*, and 605*m"*.

This scheme uses fewer selection lines than the mechanism of FIG. 6*d* (eight as opposed to 16). Of course, for larger numbers of dies, larger decoders may be employed. In general, the greater the number of individual dies to be selected, the greater the reduction in the number of die select lines required when using the scheme of FIG. 6*e* as opposed to that of FIG. 6*d*.

Another scheme, which uses individual address decoders for each die, uses fewer die select lines still.

Figure 6F:
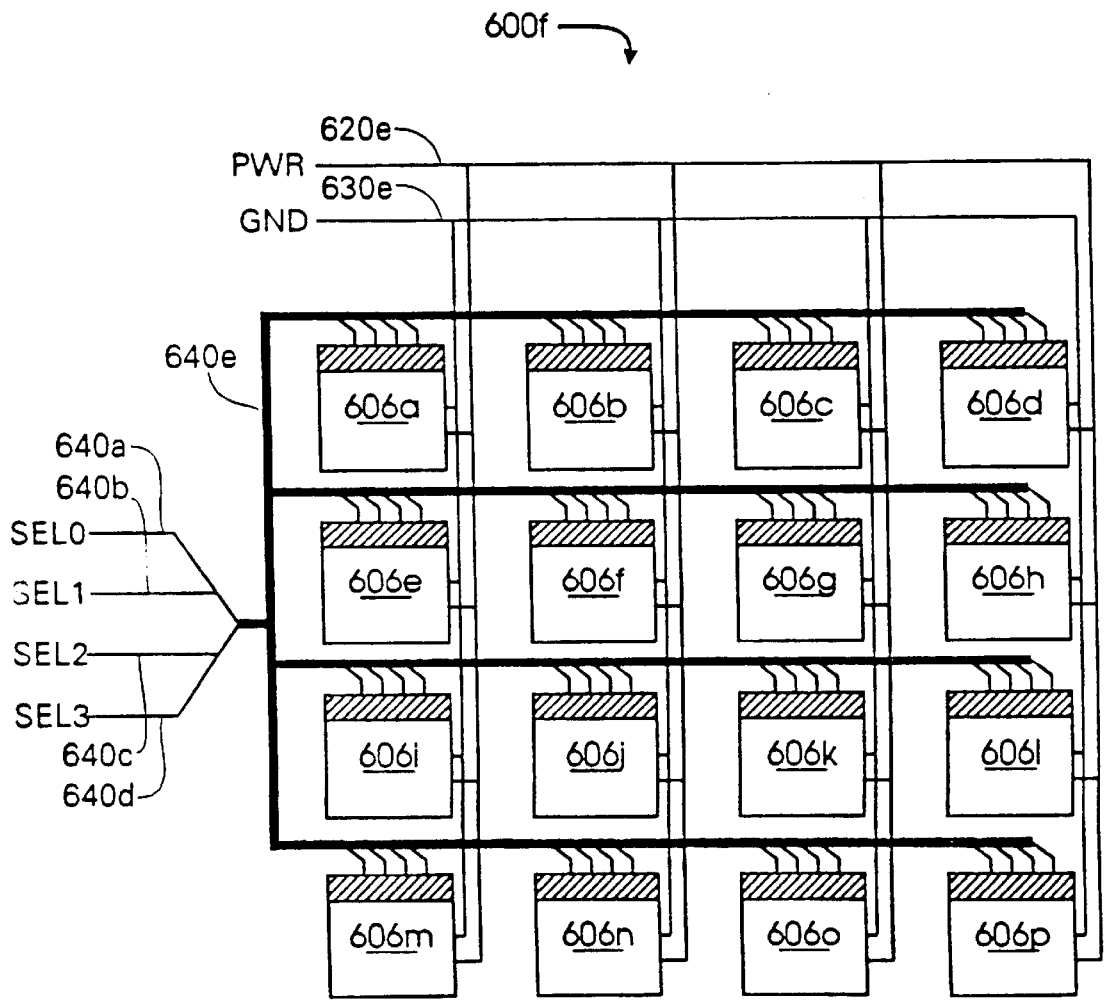

FIG. 6*f* shows an arrangement whereby each individual die is equipped to decode a unique address from address inputs "SEL0", "SEL1", "SEL2", and "SEL3" directly by means of an address decoder per die. Each die 606'*x*' is similar to dies 605'*x*' in FIGS. 6*a*–6*c*, but is equipped with a decoder (shown as a shaded are on the representation of the die in FIG. 6*f*) which decodes a unique address. All dies are connected in common to die address signals "SEL0" (on line 640*a*), "SEL1" (on line 640*b*), "SEL2." (on line 640*c*), and "SEL3" (on line 640*d*). The Figure shows a dark line 640*e* into which lines 640*a*, 640*b*, 640*c*, and 640*d* merge. This line represents a "bus" signal, which is a logical grouping of all of the lines merged into it. The lines do not lose their identity in the bus, and the bus is not a "physical" structure, as such. It is simply a notational convenience which allows the address signals in the Figure to be treated as a group. In fact, "SEL0" is connected to each die address decoder associated with a die 606'*x*', in parallel. The same is true of each of the other address signals.

The decoders are shown as a shaded area on the die. These decoders may be built into the die, may be placed in the scribe lines adjacent to the die, or placed at any convenient location in any convenient area of the wafer.

It is possible, using the techniques shown herein, to create redundant signals to dies. The motivation for providing redundant signals is to allow an alternate signal path to be used in the event that "normal" or primary signal path has been damaged or otherwise rendered inoperative. This is accomplished by one of two means: 1) doubling (or tripling, or quadrupling . . . ) up on the number of scribe line conductors used to connect to dies; or 2) providing additional, separately switched sets of lines to dies. In conjunction with this technique, it is also possible to provide redundant selection or testing circuitry connected to redundant scribe line conductors to dies to minimize the impact of a flaw in such circuitry on the ability of a wafer to be tested and/or burned in. However, in order for redundant scribe line conductors to be useful, there must be a mechanism for isolation of these lines from one another and from the flaws that would make them necessary. This is discussed below with respect to FIGS. 7'*x*'.

FIGS. 7*a*–7*f*

Hereinabove, it has been shown, that die selection may be accomplished by a combination of semiconductor switches and conductors strategically place in ordinarily unused areas of a wafer. Dies may be selectively powered up, and/or may have signals selectively distributed to them. However, the problem still remains that "normal" die sites are not the only places on a wafer which can be affected by processing flaws. It is possible for the very areas containing these die selection switches and strategically placed conductors (scribe line areas, mutant die areas, dedicated die sites, etc.) to have flaws which may affect the operation of the very structures intended to help detect such flaws elsewhere on the wafer. Further, it is possible for certain types of flaws (generally short circuits) to cause a bad die to load the selection circuitry such that selection of other undamaged dies is not possible. What is needed is a method of isolating such flaws from the remainder of the selection circuitry and providing redundant signal distribution paths so that the probability of a single point failure eliminating the capability of verifying a whole wafer is greatly reduced.

FIGS. 7*a*–7*f* illustrate various forms of diode and/or fuse isolation of signal distribution lines for this purpose. It is assumed (except where stated otherwise) that where the "sense" or polarity of the signals being distributed is such that an active (asserted, ON, TRUE) state is at a higher voltage (potential) than an inactive (unasserted, OFF, FALSE) state (often called an "active HIGH" signal, or "positive logic" signal), there is, within the die or in a scribe line area adjacent to the die, a load resistor or load current to a voltage (potential) at least low enough to be detected as an inactive state (shown in FIGS. 7*a* and 7*b* only). It is further assumed that where the sense of polarity of the signals being distributed is such that the inactive state of the signal being distributed is a higher voltage than the active state (often called an "active LOW" signal or "negative logic" signal), there is, within the die or in a scribe line area adjacent to the die, a load resistor or load current to a voltage at least high enough to be detected as an inactive state.

It should be noted that FIGS. 7*a*–7*f* are intended to be schematic representations, not physical representations. Therefore, the physical location of a diodes or fuse is not indicated by its placement in the Figures. Such diodes and/or fuses may exist physically on a die site, in a scribe line area, or in the peripheral area of the die.

Figure 7A:
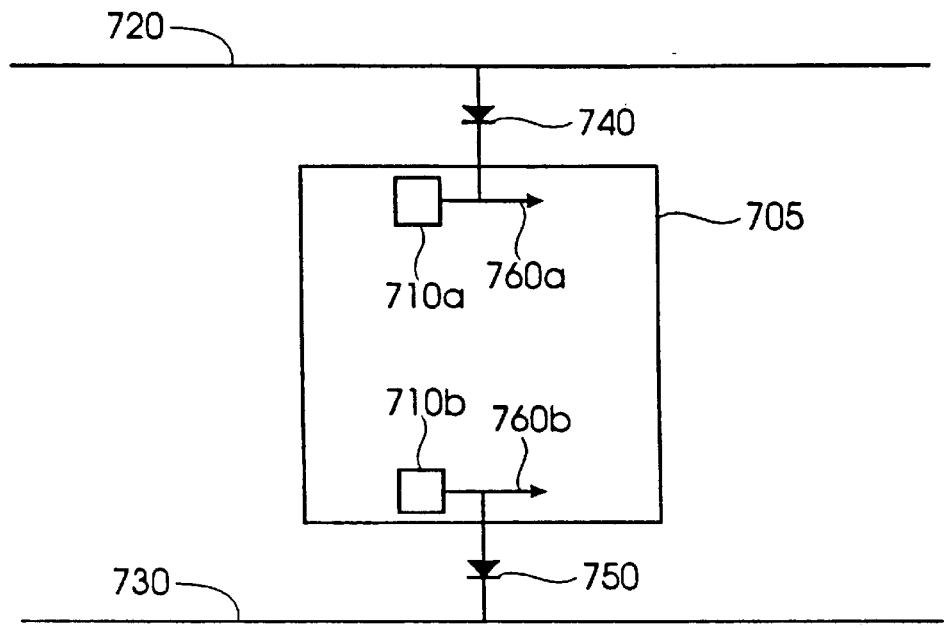
FIGS. 7a–7f illustrate various methods of diode and fuse isolation of die selection lines.

FIG. 7*a* shows diode isolation of signal carrying lines (conductors) from a die. ("Signal carrying" means carrying any type of electrical signal, including power signals) A die 705*a* having bonding pads 710*a* and 710*b* connecting to internal conductors 760*a* and 760*b*, respectively, and other internal conductors and circuitry, receives electrical signals from lines 720 and 730 through diodes 740 and 750, respectively, onto internal conductors 760*a* and 760*b*, respectively. The anode of diode 740 is connected to signal carrying line 720, and the cathode of diode 740 is connected to the internal conductor 760*a* of die 705*a* directly, bypassing bonding pad 710*a* (illustrating one form of connection to a die—direct connection to a signal associated with a bonding pad, bypassing the bonding pad). The anode of diode 750 connects to the internal conductor 760*b* of die 705*a*, bypassing bonding pad 710*b*, and the cathode of diode 750 connects to signal carrying line 730.

The polarity of diodes shown assumes that signal carrying line 720 carries either an active HIGH signal or a positive power supply line, and that signal carrying line 730 carries either an active LOW signal or a negative power supply. These diodes 740 and 750 isolate lines 720 and 730, respectively from leakage currents from die 705*a*, preventing such leakage currents from inadvertently causing an unasserted signal level of either signal carrying line 720 or 730 to become asserted. In the specific case where power supply signals are being carried on lines 720 and 730, these diodes prevent leakage currents on die 705*a* from inadvertently powering-up any other dies or other circuitry which may also be connected to lines 720 and/or 730.

Figure 7B:
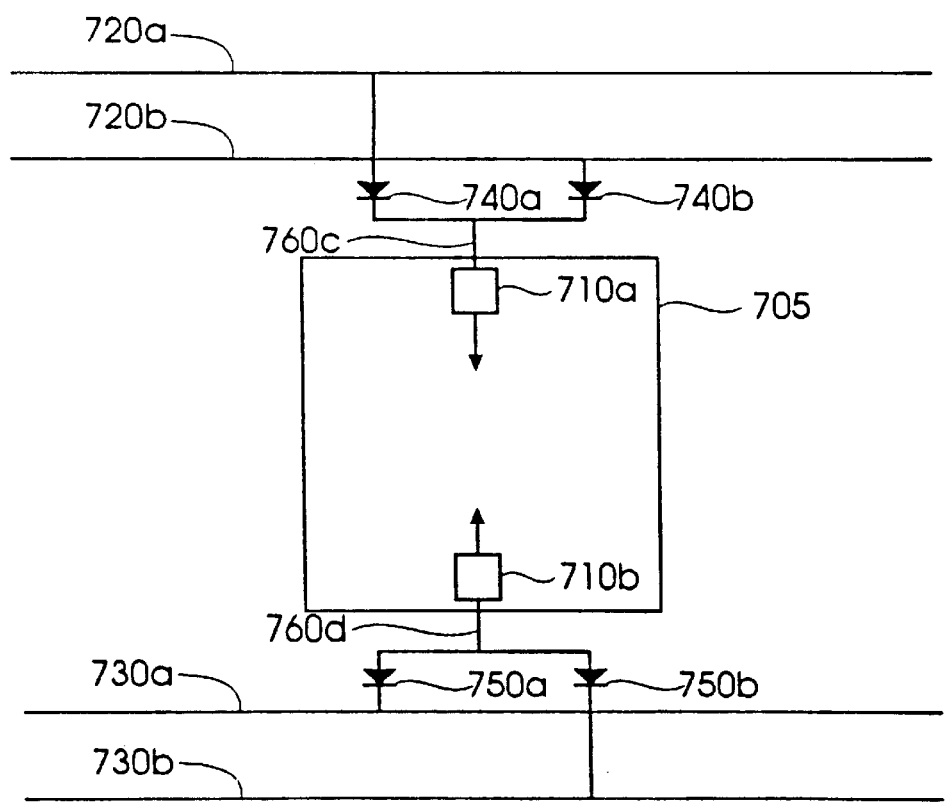

FIG. 7b shows diode isolation of redundant connections to a die. On a semiconductor wafer, there always exists the possibility that a flaw in the wafer will destroy or render inoperative some part of the wafer. Since this also include conductors, it is advantageous to provide redundant conductors as insurance against the event that one conductor is damaged. A die 705b, and four diodes 740a, 740b, 750a, and 750b are shown. Two redundant pairs of signal carrying conductors are provided: a first pair 720a and 720b; and a second pair 730a and 730b. Conductors 720a and 720b are each carrying similar signals. Conductors 730a and 730b are each carrying similar signals. The signals on conductors 720'x' may be active HIGH signals or positive power supply signals. The signals on conductors 730'x' may be active LOW signals or negative power supply signals. Die 705b has two bonding pads, 710a and 710b which each connect to different circuitry elsewhere on the die 705b. Signal carrying conductor 720a connects to the anode of diode 740a. Signal carrying conductor 720b connects to the anode of diode 740b. The cathodes of diodes 740a and 740b are connected in common (via a conductor 760c) to bonding pad 710a (illustrating a different method of connecting to a die: direct connection to a bonding pad). Signal carrying conductor 730a connects to the cathode of diode 750a. Signal carrying conductor 730b connects to the cathode of diode 750b. The cathodes of diodes 750a and 750b are connected in common (via a conductor 760d) to bonding pad 710b.

In the event that either conductor 720a or 720b is destroyed (open) or shorted to a low voltage (relative to active HIGH "asserted" voltage levels or to positive power supply voltage, depending upon the type of signal carried), it is still possible to send electrical signals to pad 710a of die 705b via the other (redundant) conductor (720b or 720a, respectively) by virtue of the isolation afforded by diodes 740a and 740b. In the event that either conductor 730a or 730b is destroyed (open) or shorted to a high voltage (relative to active LOW "asserted" voltage levels or to negative power supply voltages, depending upon the type of signal carried), it is still possible to send electrical signals to pad 710b of die 705b via the other (redundant) conductor (730b or 730a, respectively) by virtue of the isolation afforded by diodes 750a and 750b.

Figure 7C:
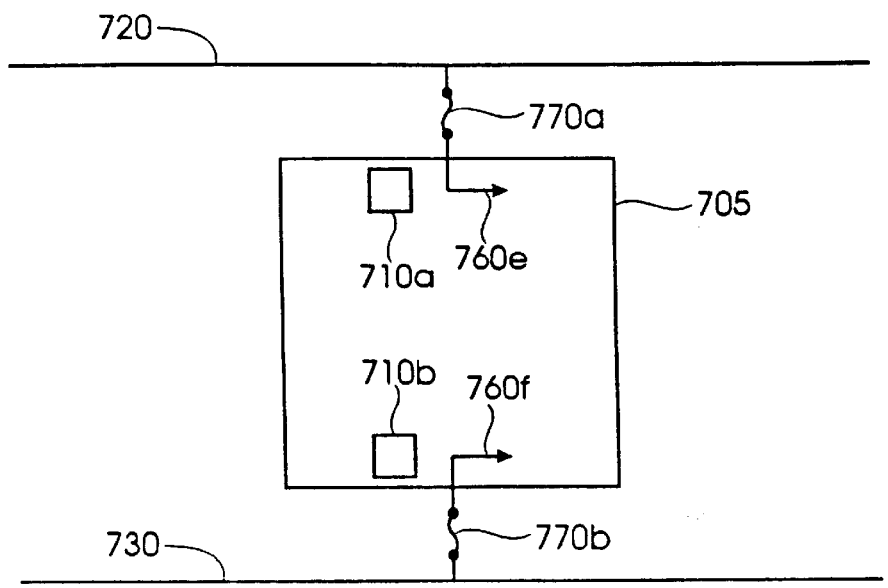

FIG. 7c shows fuse isolation of conductors from a die. A die 705c has bonding pads 710a and 710b, and internal conductors 760e and 760f not connected to any bonding pad. Internal conductor 760e is connected to one side of a fuse 770a, the other side of which is connected to signal carrying conductor 720 (showing still another method of connecting to a die: direct connection to internal signals on conductors not available at (connected to) bonding pads). Internal conductor 760f is connected to one side of a fuse 770b, the other side of which is connected to signal carrying conductor 730.

If a wafer flaw or other failure should occur in die 705c such that it causes an unwanted load or voltage (short) to be applied to signal carrying conductor 720, then die 705c may be isolated from signal carrying conductor 720 by blowing fuse 770a. In like manner, if for any reason a flaw or failure should similarly affect internal conductor 760f, then die 705c may be isolated from signal carrying conductor 730 by blowing fuse 770b.

Fuses 770a and 770b may be either passive or active fuses. A passive fuse is simply a relatively thin conductor which may be vaporized or otherwise destroyed (opened) by directing a sufficient amount of energy into it. This may be accomplished by passing a higher-than-normal amount of current through the fuse, thus causing resistive heating within the fuse, causing it to melt, vaporize, crack, or otherwise become non-conductive. Alternatively, an external focused energy beam (such as a laser) may be focused upon it, with similar results (discussed below). An active fuse is an electronic circuit designed to conduct electric currents up to a certain level. If that certain level is exceeded, the active fuse circuit is designed to stop conducting electric currents, thus emulating the behavior of a passive fuse in the presence of excessive current (higher than normal current). Both type of fuses are well known to those skilled in the art of semiconductor device manufacturing and have been used extensively in the production of such devices as fusible-link PROM's (Programmable Read Only Memories). Methods for blowing fuses, as they relate to the present invention are discussed below, with respect to FIGS. 8a–8d.

Figure 7D:
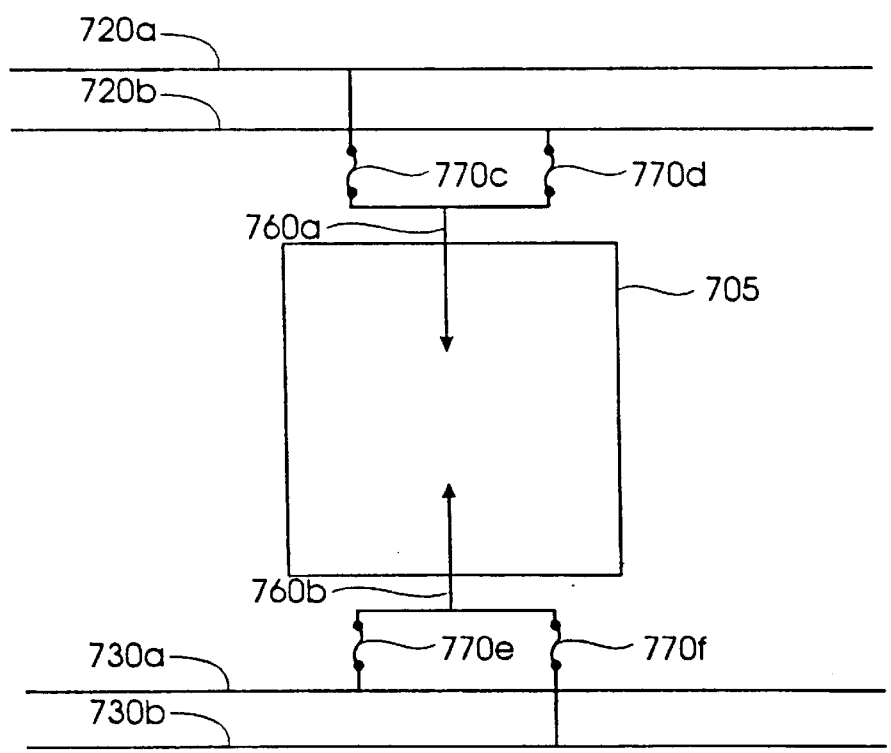

FIG. 7d shows fused isolation of redundant connections to a die. This configuration is very similar to that of FIG. 7b, but the diodes of FIG. 7b are replaced with fuses in FIG. 7d. A pair of redundant signal carrying conductors (redundant meaning that they are capable of carrying the same signal content) 720a and 720b, are provided for connection to die 705d. A similar second pair of redundant signal carrying conductors 730a and 730b are also provided for connection to die 705d. One side of each of fuses 770d and 770e is connected in common to an internal (to die 705d) conductor 760a. The remaining side of fuse 770c is connected to signal carrying conductor 720a, and the remaining side of fuse 770d is connected to signal carrying conductor 720b. Similarly, one side of each of fuses 770e and 770f is connected in common to an internal (to die 705d) conductor 760b. The remaining side of fuse 770e is connected to signal carrying conductor 730a, and the remaining side of fuse 770f is connected to signal carrying conductor 730b.

In normal operation, only one of signal carrying conductors 720a and 720b would have a signal placed on it (would be "driven"), with the other line would have no signal placed on it (would be left undriven). (Actually, the undriven line would carry substantially the same signal level as the driven conductor because of the conductive path through the fuses). If a wafer flaw or other failure should cause one of the two signal carrying conductors to short to another signal or to malfunction in any way, then all of the fuses connected to the shorted or malfunctioning signal carrying conductor can be blown to isolate it from the other signal carrying conductor. For example, if a wafer flaw or other failure affects signal carrying conductor 720a, the fuse 770a may be blown to isolate it from signal carrying conductor 720b, while leaving the connection to internal conductor 760a for signal carrying conductor 720b (via fuse 770b) intact. Similarly, if a wafer flaw or other failure affects signal carrying conductor 720b, the fuse 770b may be blown to isolate it from signal carrying conductor 720a, while leaving the connection to internal conductor 760a for signal carrying conductor 720a (via fuse 770a) intact. Isolation of signal carrying conductors 730a and 730b from one another is accomplished in much the same fashion via fuses 770e and 770f.

If a wafer flaw or other failure of die 705d (such as a short circuit) should cause internal conductor 760a to interfere in any way with normal signal carrying characteristics of signal carrying conductors 720a or 720b, then both fuses 770c and 770d may be blown in order to isolate lines 720a and 720b from the flaw, from internal conductor 760a, and from die 705d. Similarly, if a wafer flaw or other failure of die 705d (such as a short circuit) should cause internal conductor 760b to interfere in any way with normal signal carrying characteristics of signal carrying conductors 730a or 730b, then both fuses 770e and 770f may be blown in order to isolate lines 730a and 730b from the flaw, from internal conductor 760b, and from die 705d.

Figure 7E:
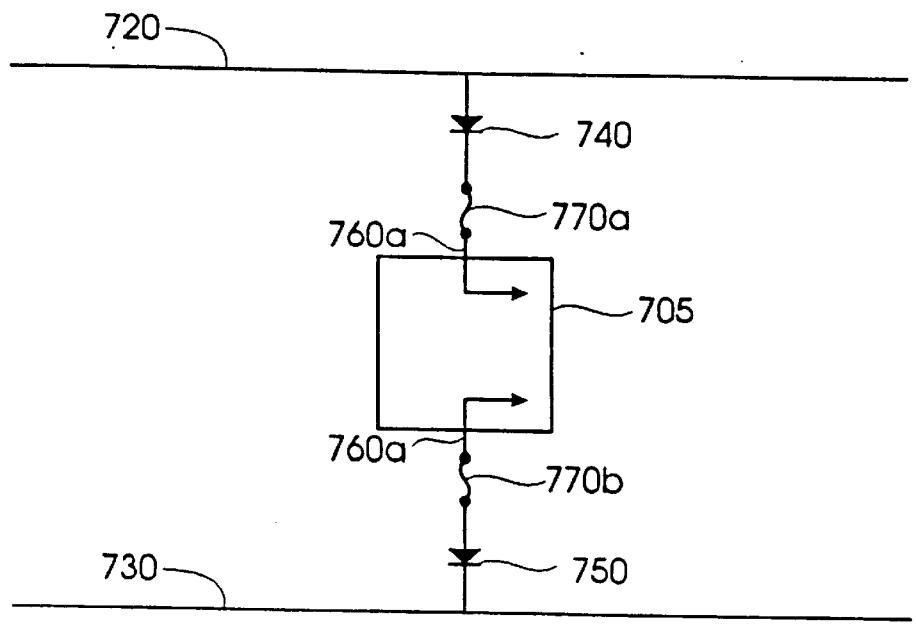

FIG. 7e shows combined diode and fuse isolation of signal carrying conductors from faults in a die. In FIG. 7e there are two signal carrying conductors 720 and 730. Signal carrying conductor 720 is connected to the anode of a diode 740. The cathode of diode 740 is connected to one side of a fuse 770a. The other side of fuse 770 a is connected to an internal conductor 760a on a die 705e. Signal carrying conductor 730 is connected to the cathode of a diode 750. The anode of diode 750 is connected to one side of a fuse 770b. The other side of fuse 770b is connected to another internal conductor 760b on a die 705e. The isolation with regard to diodes 740 and 750 is identical to that described for FIG. 7a. The fuses 770a and 770b provide for additional isolation in the event of a short circuit on die 705e. The order of series connection of fuse 770a and diode 740, and that of fuse 770b and diode 750 is unimportant. As long as diode polarity is maintained, the order of series connection of fuses and diodes may be reversed without impact.

Figure 7F:
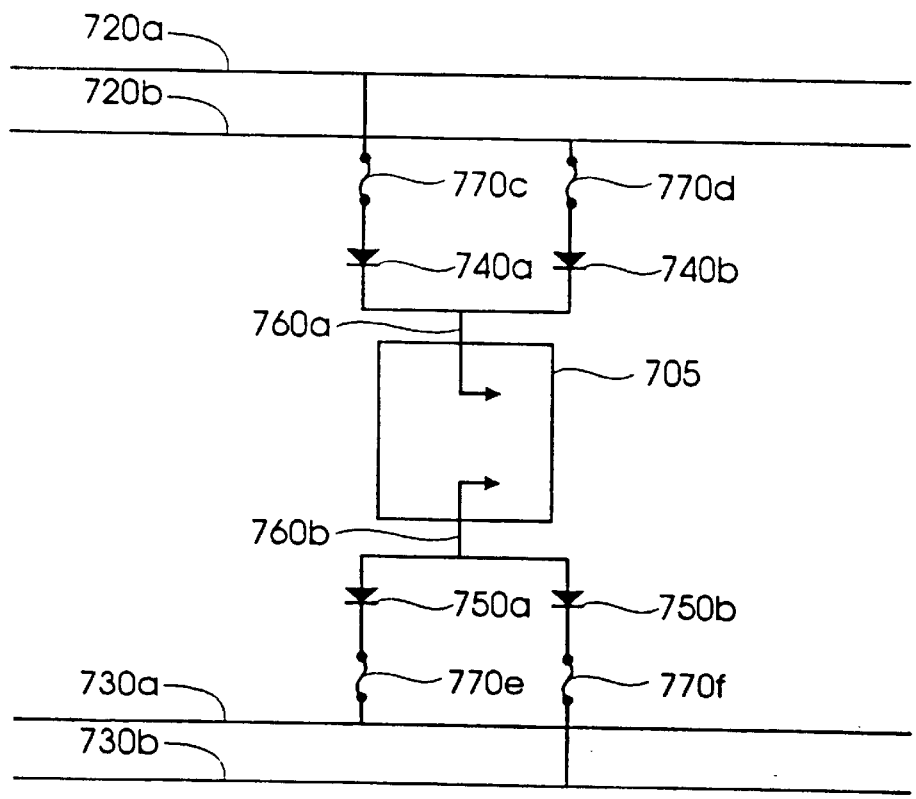

FIG. 7f shows combined diode and fuse isolation of signal carrying conductors from one another and from flaws on a die. A signal carrying conductor 720a is connected to one side of a fuse 770c. The other side of fuse 770c is connected to the anode of a diode 740a. A signal carrying conductor 720b is connected to one side of a fuse 770d. The other side of fuse 770d is connected to the anode of a diode 740b. The cathodes of diodes 740a and 740b are connected in common to an internal conductor 760a on a die 705f. Similarly, a signal carrying conductor 730a is connected to one side of a fuse 770e. The other side of fuse 770e is connected to the cathode of a diode 750a. A signal carrying conductor 730b is connected to one side of a fuse 770f. The other side of fuse 770f is connected to the cathode of a diode 750b. The anodes of diodes 750a and 750b are connected in common to an internal conductor 760b on die 705f.

The functions of diodes 740a, 740b, 740c, and 740d, are identical to their respective functions as described for FIG. 7b. Additionally, fuses 770c and 770d provide for isolation of signal carrying conductors 720a and 720b from a short circuit on internal conductor 760a or other similar flaw on die 705f; and fuses 770e and 770f provide for isolation of signal carrying conductors 730a and 730b from a short circuit on internal conductor 760b or other similar flaw on die 705f.

Figure 8A:
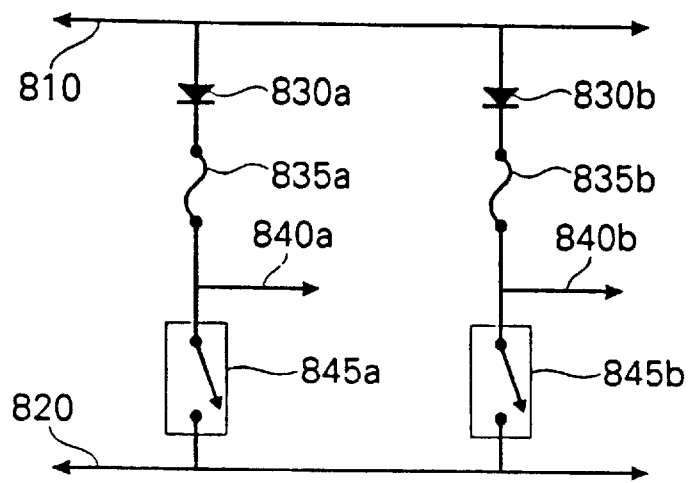
FIGS. 8a–8c illustrate techniques for blowing fuses on fuse-isolated die selection lines as they relate to the present invention.
Figure 8B:
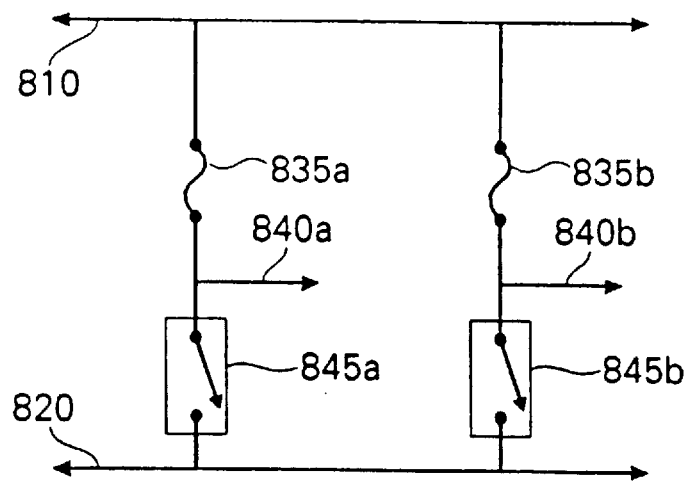
Figure 8C:
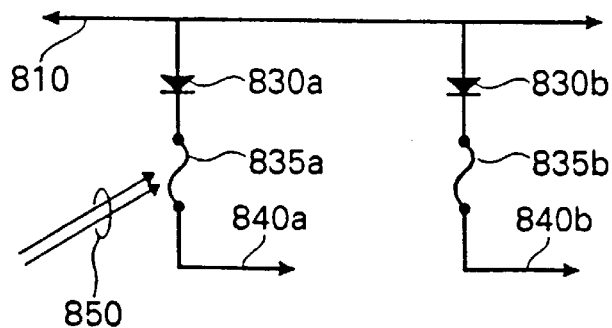

FIGS. 8a–8c

The fused isolation schemes discussed above require methods of blowing fuses to sever connections to damaged, superfluous, or unnecessary circuitry. The ensuing discussion with respect to FIGS. 8a–8c gives methods of doing this.

FIG. 8a shows a method and apparatus for blowing fuses where combined fuse and diode isolation is employed. Accordingly, there are two conductors 810 and 820. Conductor 810 is intended to be connected to a number of different points via a fuse and diode isolation scheme. Two such isolation structures are shown. Conductor 810 connects to the anodes of diodes 830a and 830b. The cathode of diode 830a is connected to one side of a fuse 835a. The other side of fuse 835a is connected to one side of a semiconductor switch 845a and to a conductor 840a which makes further connection elsewhere. The cathode of diode 830b is connected to one side of a fuse 835b. The other side of fuse 835b connects to one side of a semiconductor switch 845b and to a conductor 840b which makes further connection elsewhere. The remaining sides of semiconductor switches 845a and 845b are connected to conductor 820.

In the event that a flaw necessitates the isolation of conductor 810 from conductor 830a, fuse 830a may be blown by:

a) applying voltages to conductors 810 and 820 such that conductor 820 is at a lower voltage than conductor 810, and b) closing switch 845a, blowing fuse 835a.

Similarly, in the event that a flaw necessitates the isolation of conductor 810 from conductor 830b, fuse 830b may be blown by:

a) applying voltages to conductors 810 and 820 such that conductor 820 is at a lower voltage than conductor 810, and b) closing switch 845b, blowing fuse 835b.

There will be a minimum voltage differential and current carrying capacity across conductors 810 and 820. This differential and current carrying capacity is determined partially, by the characteristics of fuses 835a and 835b. Additionally, this voltage differential must include any amount required to overcome the diode drop of (voltage drop across) diodes 830a or 830b, and the saturation voltage (voltage drop across), switch 845a or 845b.

FIG. 8b shows a method of blowing fuses where only fuse isolation is employed. The connections are all identical to those of FIG. 8a, except that diodes 830a and 830b in FIG. 8a are eliminated in FIG. 8b, with fuses 835a and 835b having one side connected directly to conductive line 810. Operation of this arrangement to blow a fuse is identical to that of FIG. 8a, except that without the diodes present, no diode drops need to be overcome, and the polarity of the voltage differential applied across conductors 810 and 820 is no longer relevant.

FIG. 8c shows a directed energy beam fuse blowing method for fused isolation schemes. A fuse and diode isolation scheme is shown whereby a conductor connects to the anodes of two diodes 830a and 830b. The cathode of diode 830a connects to one side of a fuse 835a. The other side of fuse 835a connects to a conductor 840a which makes further connection elsewhere. The cathode of diode 830b connects to one side of a fuse 835b. The other side of fuse 835b connects to a conductor 840b which makes further connection elsewhere. In order to blow fuse 835a a tightly focused energy beam 850, such as a laser, is directed at fuse 835a, imparting sufficient energy to fuse 835a to cause it to vaporize, melt, break, or otherwise become open.

Figure 9A:
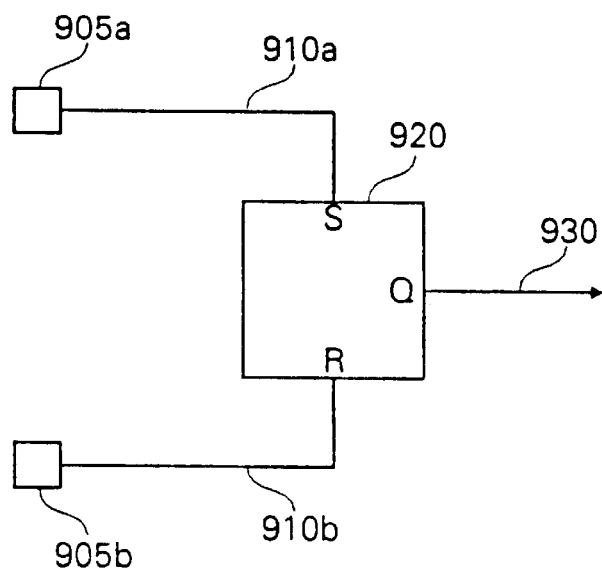
FIGS. 9a and 9b show an auxiliary circuit for use with E-beam probing as it relates to the present invention.
Figure 9B:
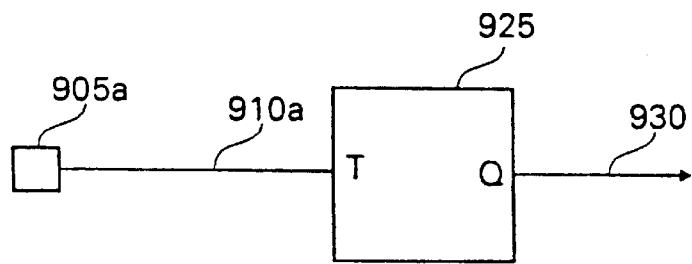

FIGS. 9a, 9b

E-beam probing, whereby an electron beam may be used to impart electrical signals to a structure on a wafer, and/or to read back electrical signal levels, is well known. This non-contact, beam-oriented technique has a number of advantages over mechanical probing, particularly in that large contact area are not required. An E-beam may be focused extremely tightly and aimed at any convenient point on a wafer. However, as a focused beam, E-beams are not capable of massively parallel excitation of electrical signals on a wafer. As such, complex selection and probing schemes with E-beams are not possible without some sort of auxiliary electronics.

FIG. 9a shows an auxiliary circuit which may be placed on a die to facilitate E-beam probing and sensing. Two access points 905a and 905b, something like "touch pads" for an E-beam probe are provide in some accessible (to the E-beam) area of the wafer. An S-R flip-flop 920 connects to these touch pads such that the set input "S" of the flip-flop 920 connects to touch pad 905a via a line 910a, and the reset input "R" of the flip-flop 920 connects to touch pad 905b via a line 910b. The output "Q" of the flip-flop 920 generates an output signal on a line 930, which may be used elsewhere. The E-beam may activate the set or reset inputs of flip-flop 920 at any time via touch pads 905a or 905b, respectively. (It may also apply a signal directly to lines 910a or 910b, if they are accessible.) If the set input of flip-flop is activated, the Q output will activate (or set) the output signal on line 930, and will leave it activated until a reset signal is received on the reset input of flip-flop 920. If the reset input of the flip-flop 920 is activated, then the W output will de-activate (or reset) the output signal on line 930 and will leave it de-activated until a set signal is received on the set input of flip-flop 920.

If a plurality of these circuits are provided on the wafer, preferably in the scribe lines or in the peripheral area, then a mechanism is available by which an E-beam may set up complex combinations of signals of the wafer for test purposes. For, example, if a wafer contains 100 dies, then 7 such circuits could be used by an E-beam probe to set up an address for selecting dies.

FIG. 9b shows a similar scheme, which uses only one "touch pad" 905c. The signal on the touch pad 905c is carried to the toggle (T) input of a toggle flip-flop 925 via a line 910c. The output (Q) of the toggle flop is placed on a line 930, which may be used elsewhere (the same as for FIG. 9a). The circuit of FIG. 9b operates similarly to that of FIG. 9A, except that each time touch pad 905c (or line 905c) is "touched" by the E-beam, output Q (and therefore the signal on line 930) changes state (from activated to de-activated, or vice versa).

FIGS. 10a–10e

The methodology of multiplexing a plurality of sets of lines (e.g., power and ground) disposed in either one of the horizontal or vertical scribe lines can be extended to multiplexing additional lines in both the horizontal or vertical scribe lines, and is discussed below with respect to FIGS. 10a–10e.

Figure 11:
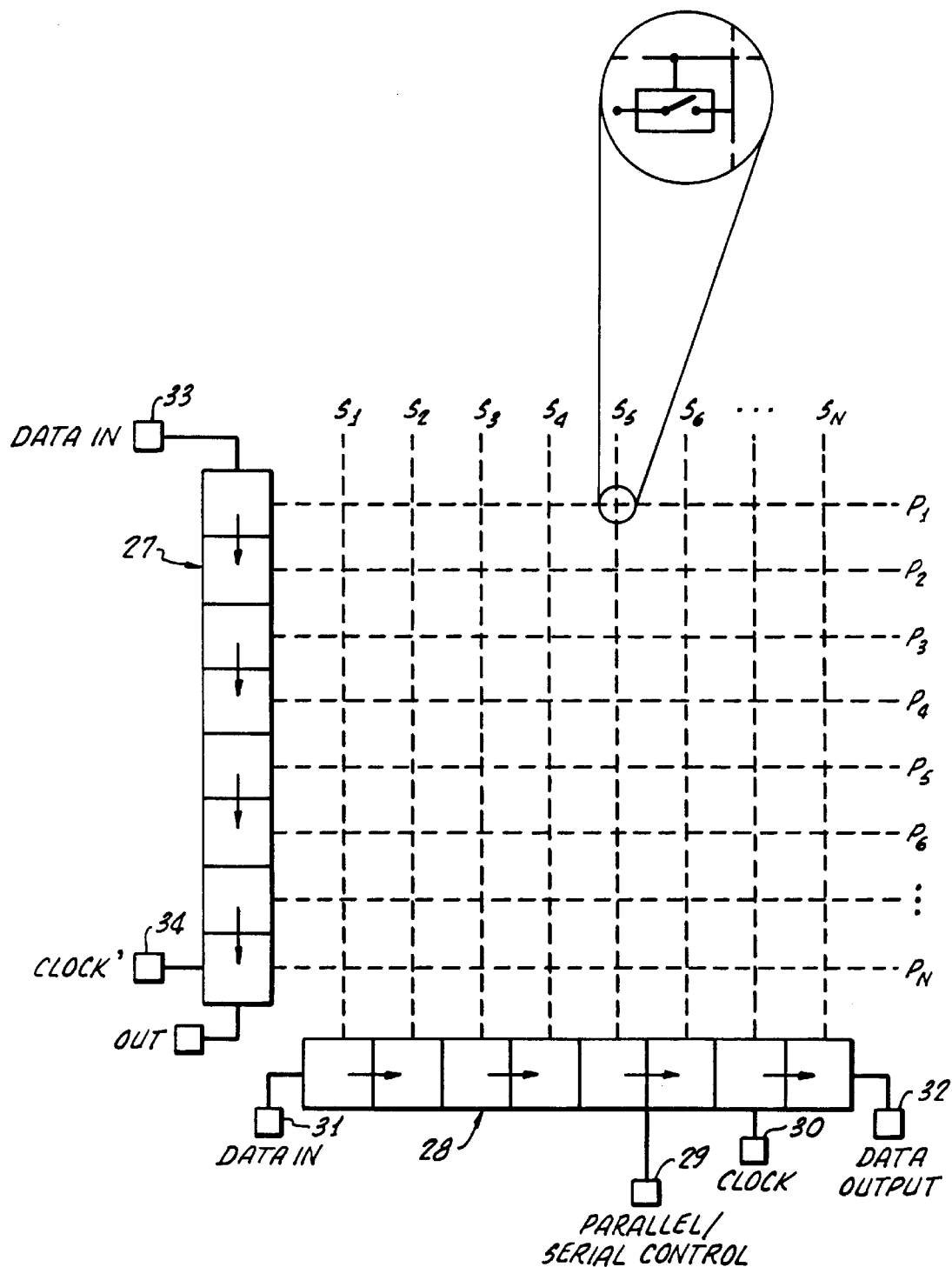
FIG. 11 is a schematic of a prior art technique for implementing cross-check testing on a die.

As shown in FIG. 4 of the aforementioned U.S. Pat. No. 4,749,947, (reproduced herein as FIG. 11) it is possible to reduce the number of cross-check connections, per die, vis-a-vis the actual number of cross check lines traversing the die. As noted therein, a shift register (27) can be used to control a plurality of probe-lines, and are designed to activate only one probe-line at a time during testing. Another shift register (28) is connected to the sense-lines. Activating one probe line causes signals to be impressed on all of the sense lines—hence the sense line shift register (28) is operated in a parallel mode to fetch and store information from the sense lines, and is then operated in a serial clocked mode to transfer the signals from the sense lines out serially to a single probe point (32). This whole schema of reducing the test points from a one-to-one correspondence, to the number of probe and sense lines requires essentially only one connection for all of the probe lines, one connection for all of the sense lines, plus a few clock and control connections that is not related to the number of probe and sense lines.

The 4,749,947 patent also suggests further reduction in the number of probe points necessary to implement the cross check technique, by replacing the shift register (27) controlling the probe lines with an on-chip circuit such as a counter that during testing would activate the probe lines one at a time in an orderly manner without the need for external date entry (see column 8, lines 55–63).

The 4,749,947 patent also discusses that the use of on-chip shift registers will slow down the speed of testing, since the output data can be measured only one bit at a time, as compared to being able to measure all of the sense line outputs at once. Therefore, it is suggested in the patent that "both the sense-line and the shift register outputs can be brought out to probe-points to allow direct probing of the sense-lines at wafer level, and only shift-register probing for later testing when the IC is packaged." (column 9, lines 10–14)

While not suggested or taught by the 4,749,947 patent, this general methodology of reducing the number of test points required to access a much greater number of individual cross check test lines, can be utilized at wafer level.

Figure 10A:
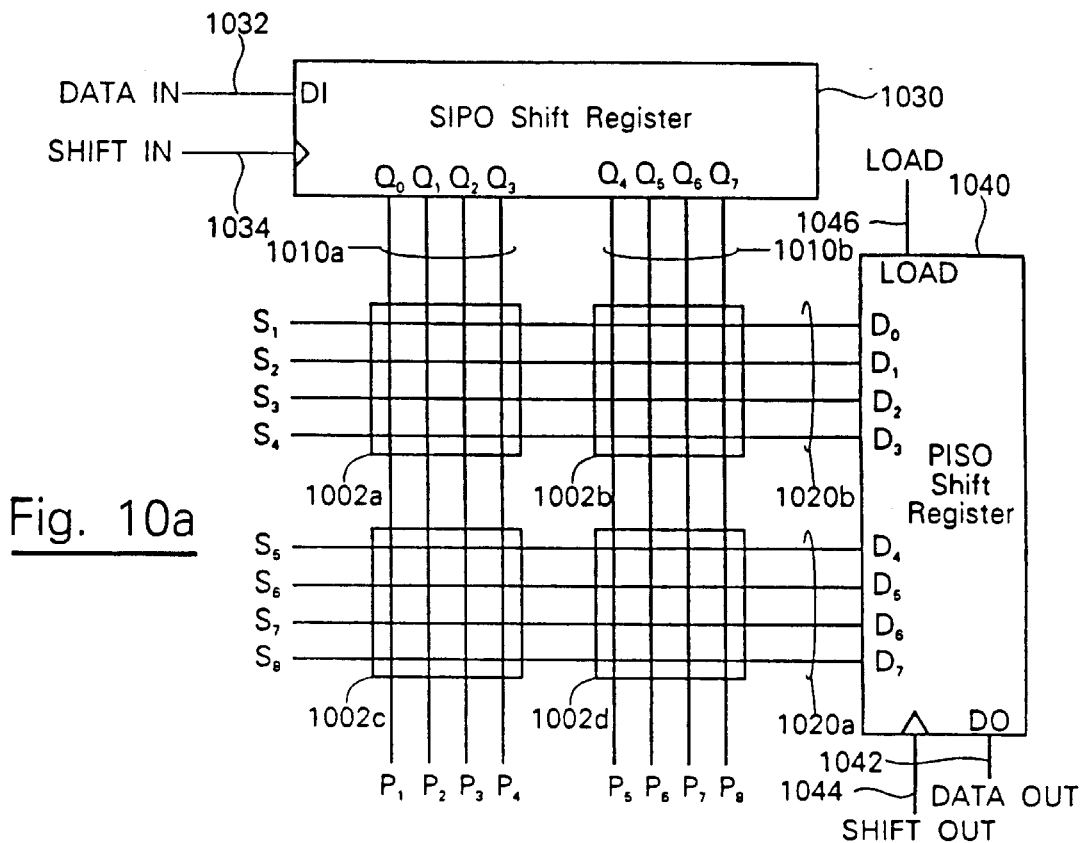
FIGS. 10a–10e illustrate various techniques for reducing the number of external interface points required for wafer-level burn-in and testing.

FIG. 10a shows an example of using shift registers for selectively connecting a limited number of signals to a relatively large number of dies on a wafer. In this example, an artificially small number of dies (four dies shown: 1002a, 1002b, 1002c, and 1002d) and an artificially small number of probe and sense lines per die are shown (four probe lines P'x' per die, grouped in sets of four 1010'x', and four sense lines S'x' per die, grouped in sets of four 1020'x') are presented for illustrative clarity. On a typical wafer, a substantially number of dies, probe line and sense lines would be used. A plurality of sets of probe lines (1010a and 1010b shown), each set sufficient for probing any given die (one of 1002a, 1002b, 1002c, or 1002d) on the wafer, are disposed in the scribe lines, and another plurality of sets of sense lines 1020, again each set sufficient for accessing the sense lines of any individual die, are also disposed in the scribe lines.

A probe shift register 1030 is provided, the outputs of shift register 1030 driving the probe lines. The shift register 1030 is of the SIPO (Serial in-Parallel out) type, whereby data presented on a "DATA INPUT" line 1032 to the DI (data in) input of shift register 1030 is clocked into shift register 1030 by a "SHIFT IN" clock signal presented on a line 1034 to the clock (>) input of shift register 1030. As the "DATA IN" signal is clocked in, its data values are shifted serially along shift register outputs $Q_{0-7}$ and placed on sets of probe lines 1010, connected thereto.

A sense shift register 1040 is provided, the inputs $D_{0-7}$ of shift register 1040 receiving the signal values on sets of sense lines 1020. The shift register 1040 is of the PISO (Parallel in-Serial out) type, whereby data presented at the inputs of shift register 1040 on sense lines 1020'x' are latched by a "LOAD" signal presented at the load input of shift register 1040 on a line 1040 and are shifted out onto a data out line 1042, one data value at a time, by a "SHIFT OUT" clock signal presented on a line 1044 to the clock input of shift register 1040.

In this manner, the number of interface signals (probe and sense signals) is reduced to five, for virtually any number of dies. For more dies, sense lines and probe lines, longer shift registers 1030 and 1040 are used.

Figure 10C:
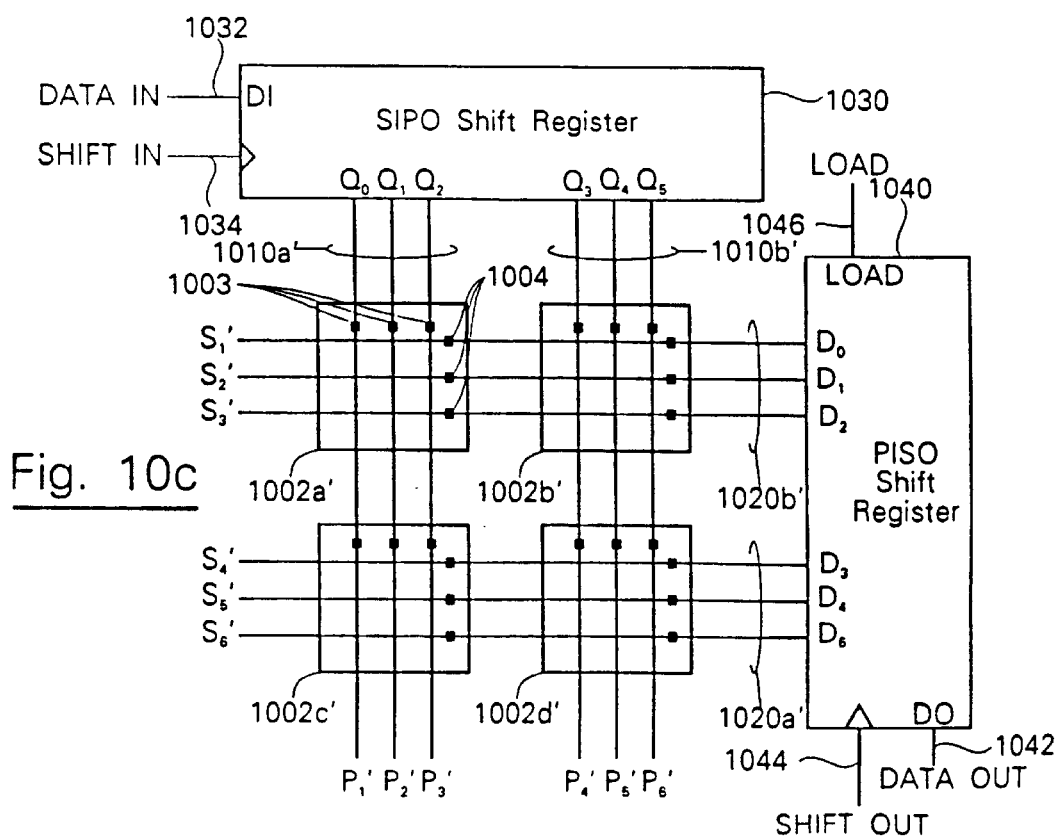
Figure 10B:
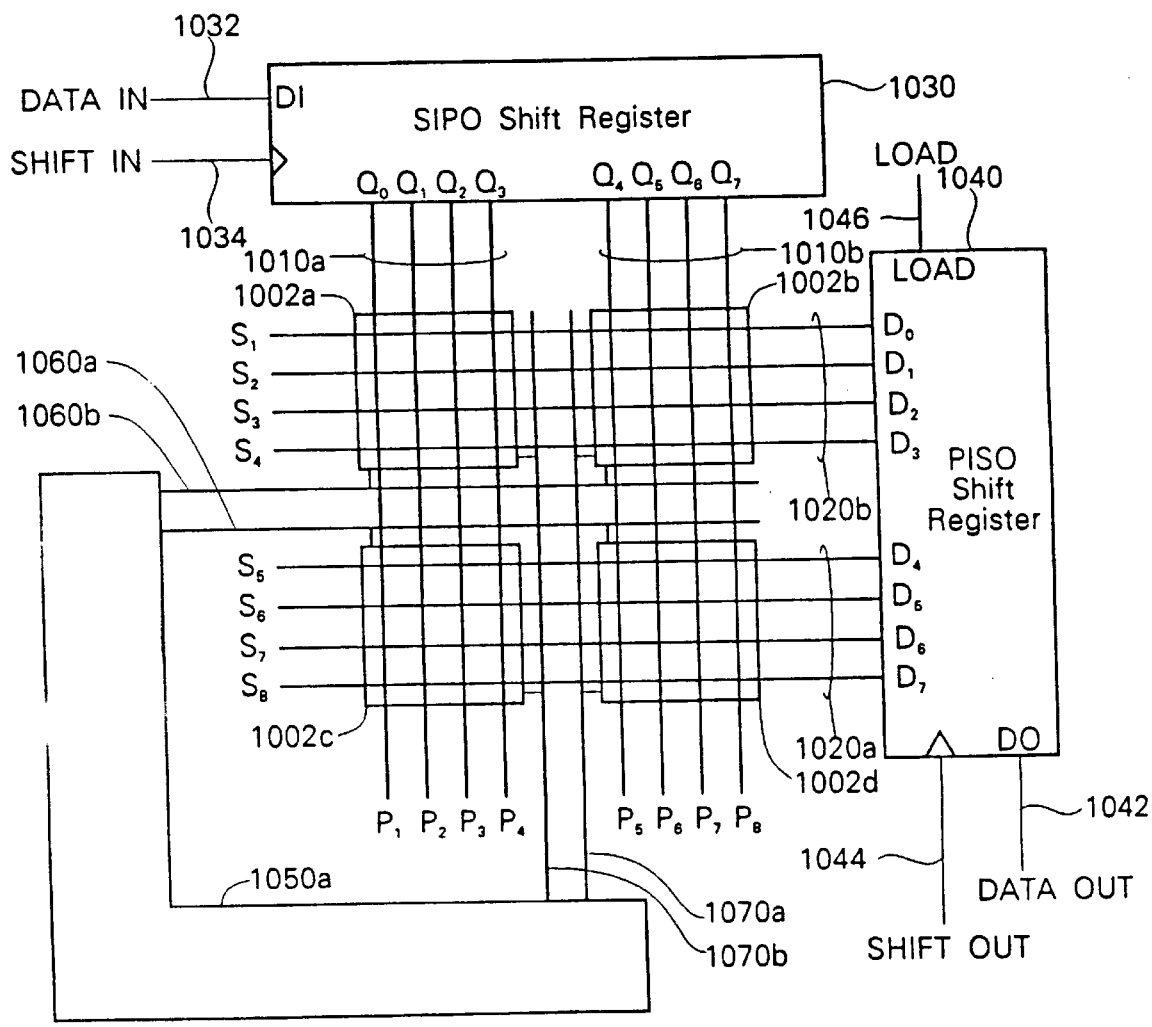

FIG. 10b adds die selection to the scheme of FIG. 10a. In many cases, more than one die responding would cause signal collisions on the probe and sense lines, so die selection is added as a way to eliminate these collisions, and to isolate individual dies. FIG. 10b is identical in all respects to FIG. 10a except that a die selection switch 1050, of any suitable type discussed hereinabove, is provided such that individual dies 1002a, 1002b, 1002c, and 1002d may be selected. The scheme shown is a row-column selection scheme, particularly well suited to die selection by powering up dies. However, any die selection scheme discussed hereinabove may be substituted. Further, any of the redundant line techniques, diode isolation or fuse isolation schemes may also be applied.

FIG. 10c shows a further efficiency improvement in this method of reducing test connections through the use of shift registers. The number of dies has been artificially reduced for illustrative clarity. A typical application would have a large number of dies. Four dies (1002a′, 1002b′, 1002c′ and 1002d′) are shown, similar to dies 1002'x' in FIGS. 10a and 10b, except that these dies employ the cross-check shift register scheme referred to in U.S. Pat. No. 4,749,947, thus reducing the number of probe and sense lines per die substantially. In the Figure, three probe lines and three sense lines are shown per die (not substantially different from the actual number likely for such an application, as opposed to a significantly larger number where the die probe/sense grid is simply extended over the die). Die 1002a′ is shown as typical of the remainder of the dies (1002b′, 1002c′ and 1002d′) having three probe points 1003 and three sense points 1004. In the Figure, probe points 1003 are joined (by lines 1010′) in a columnar fashion, which sense points 1004 are joined in a row-oriented fashion (by lines 1020′). In a manner similar to that shown in FIGS. 10a and 10b, probe lines 1010 are driven by a SIPO shift register 1030a having a data input signal on a line 1032 and a shift in clock signal on a line 1032. Also similar to the scheme shown in FIGS. 10a and 10b, the sense lines 1020′ are connected to the data inputs of a PISO shift register 1040a, which has a load input on a line 1046, a shift clock input on a line 1044, and a data output on a line 1042. Note that the external interface (non-probe and non-sense connections to the shift registers) is identical to that of FIGS. 10a and 10b, even though the interfaces to the dies are different. While there will be differences in the meaning of the data applied at "DATA IN" and data output on "DATA OUT", between FIG. 10c and FIGS. 10a and 10b, the physical interface is identical.

This scheme does not alter the number of interface points required, but it does reduce the number of probe and sense lines routed about the wafer. These lines may be placed by any suitable means in any convenient place on the wafer, such as in the scribe lines adjacent to the wafers to which they are to be connected, or in a grid of overlying metal.

Figure 10D:
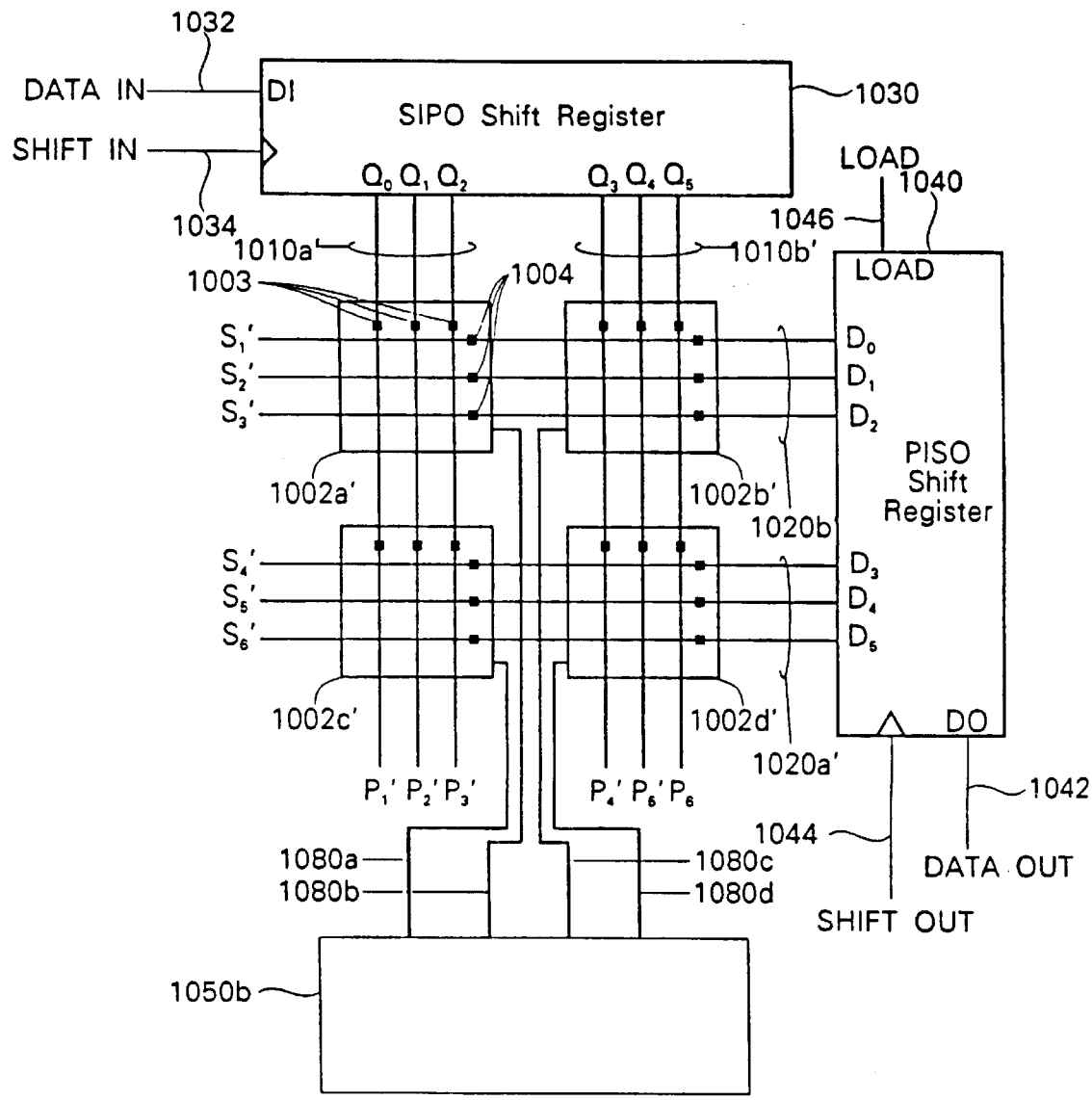

FIG. 10d shows a technique identical to that of FIG. 10c, except that a die selection switch 1050b is added for the purpose of selecting individual dies. In this case, lines 1080a, 1080b, 1080c, and 1080d, connect directly to dies 1002a′, 1002b′, 1002c′, and 1002d′, respectively, in a manner particularly well suited to logical die selection by a signal. This scheme may also be used for power-supply based selection of dies where one supply line (e.g. ground) is provided to all dies is common, and the other supply line (e.g., power) is switched. Any other die selection scheme may be substituted and/or redundant line scheme, fuse isolation or diode isolation scheme applied.

Figure 10E:
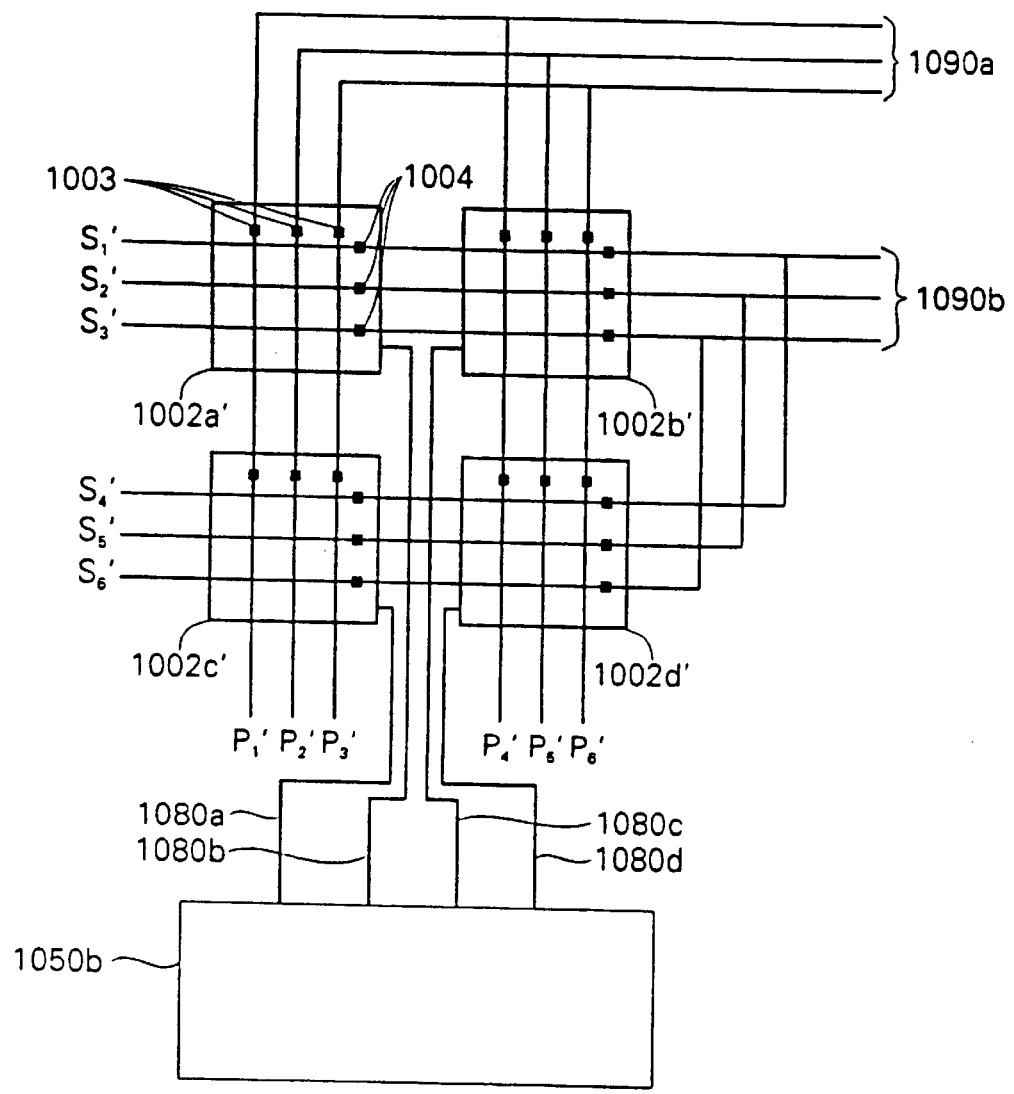

FIG. 10e shows a further reduction in the number of probe and sense lines required. A selection scheme identical to that of FIG. 10d is shown. However, rather than connecting probe and sense lines in row-and-column based sets, the sets are connected in paralleled into a single set of common probe lines 1090a and a single common set of sense lines 1090b, which may be processed elsewhere on the wafer by any suitable means, or which may be brought out to external interface points directly.

FIGS. 10a–d demonstrated the use of shift registers as a mechanism for reducing the number of interface points on a wafer, but because of the process of shifting stimuli in and out, the speed of operation is adversely affected. Another approach is possible by using multiplexers, (e.g. selector switches of the type shown in FIGS. 4'x' and 5'x') rather than shift registers to access sets of probe and sense lines. By this mechanism, full speed exercising is made possible.

Any such circuitry (i.e., shift registers and or multiplexers) may be placed at any convenient location on the wafer, preferably in the scribe lines, in a dedicated "normal" die site, in a mutant die site, or in the peripheral area of the wafer.

It should be noted that for many of the techniques shown herein, two precautions (generally applicable to IC testing, as well) are in order:

a) The power system used to provide power to the wafer should be very well regulated and relatively noise-free.

b) Unused inputs (particularly CMOS inputs) should be terminated (loaded) so that they do not generate extraneous noise.

Using the methods and techniques shown herein, dies may be powered singly or in groups for the purpose of wafer-level static burn-in. Also, by making use of die selection schemes in conjunction with the test interfaces shown in FIGS. 10a–e, unsingulated dies may be exercised while powered (dynamic burn-in) or functionally tested, providing nearly 100% fault coverage.

What is claimed is:

1. A fault-tolerant method of providing signals from a common external source to individual, unsingulated dies on a semiconductor wafer, comprising:

defining a plurality of individual dies on a semiconductor wafer, said dies ultimately being processed into integrated circuit devices;

providing an electronic selection mechanism, on the wafer, for providing signals to selected individual dies; and providing a first conductive path between said electronic selection mechanism and a first of said dies, said first conductive path comprising:

a first signal carrying line;

a second signal carrying line;

a first diode having an anode and a cathode, said first diode anode being connected to said first signal carrying line;

a second diode having an anode and a cathode, said second diode anode being connected to said second signal line; and a first internal conductor connected to the first die, said first internal conductor being additionally connected to said first diode cathode and to said second diode cathode.

2. The method of claim 1 further comprising the step of:

applying a positive logic signal to said first conductive path.

3. The method of claim 1 further comprising the step of:

applying a positive voltage to said first conductive path.

4. The method of claim 1 further comprising the step of:

connecting said first internal conductor to a bonding pad within said first unsingulated die.

5. The method of claim 1 further comprising the step of:

providing a second conductive path between said electronic selection mechanism and the first die, said second conductive path comprising:

a third signal carrying line;

a fourth signal carrying line;

a third diode having an anode and a cathode, said third diode cathode being connected to said third signal carrying line;

a fourth diode having an anode and a cathode, said fourth diode cathode being connected to said fourth signal line;

a second internal conductor connected to the first die, said second internal conductor being additionally connected to said third diode anode and to said fourth diode anode.

6. The method of claim 5 further comprising the step of:

applying a negative logic signal to said second conductive path.

7. The method of claim 6 further comprising the step of: applying a negative voltage to said second conductive path.

* * * * *